US008859324B2

(12) United States Patent
Stewart et al.

(10) Patent No.: US 8,859,324 B2
(45) Date of Patent: Oct. 14, 2014

(54) METHODS OF MANUFACTURING SOLAR CELL DEVICES

(71) Applicants: Michael P. Stewart, San Francisco, CA (US); Prabhat Kumar, Fremont, CA (US); Kapila P. Wijekoon, Palo Alto, CA (US); Lin Zhang, San Jose, CA (US); Hari K. Ponnekanti, San Jose, CA (US)

(72) Inventors: Michael P. Stewart, San Francisco, CA (US); Prabhat Kumar, Fremont, CA (US); Kapila P. Wijekoon, Palo Alto, CA (US); Lin Zhang, San Jose, CA (US); Hari K. Ponnekanti, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/739,390

(22) Filed: Jan. 11, 2013

(65) Prior Publication Data

US 2013/0183796 A1   Jul. 18, 2013

Related U.S. Application Data

(60) Provisional application No. 61/585,926, filed on Jan. 12, 2012.

(51) Int. Cl.
*H01L 21/00* (2006.01)
*H01L 31/0224* (2006.01)

(52) U.S. Cl.
CPC ........ *H01L 31/022425* (2013.01); *Y02E 10/50* (2013.01)
USPC ............................... 438/98; 438/57; 136/256

(58) Field of Classification Search
USPC ....................... 438/57, 98; 136/256
See application file for complete search history.

(56) References Cited

U.S. PATENT DOCUMENTS 3,849,880 A   11/1974  Haynos
3,979,241 A   9/1976   Maeda et al.

(Continued)

FOREIGN PATENT DOCUMENTS

JP   2006-080450   3/2006
JP   2008-109164   5/2008

(Continued)

OTHER PUBLICATIONS

Kim, et al., "Silicon Solar Cells With Boron Back Surface Field Formed by Using Boric Acid", Georgia Institute of Technology, School of Electrical and Computer Engineering.

(Continued)

*Primary Examiner* — Alexander Ghyka
(74) *Attorney, Agent, or Firm* — Patterson & Sheridan, LLP

(57) ABSTRACT

Embodiments of the present invention are directed to a process for making solar cells. Particularly, embodiments of the invention provide simultaneously co-firing (e.g., thermally processing) metal layers disposed both on a first and a second surface of a solar cell substrate to complete the metallization process in one step. By doing so, both the metal layers formed on the first and the second surfaces of the solar cell substrate are co-fired (e.g., simultaneously thermally processed), thereby eliminating manufacturing complexity, cycle time and cost to produce the solar cell device. Embodiments of the invention may also provide a method and solar cell structure that requires a reduced amount of a metallization paste on a rear surface of the substrate to form a rear surface contact structure and, thus, reduce the cost of the formed solar cell device.

17 Claims, 11 Drawing Sheets

(56) References Cited

U.S. PATENT DOCUMENTS

| | | |
|---|---|---|
| 4,084,985 A | 4/1978 | Evans, Jr. |
| 4,104,091 A | 8/1978 | Evans, Jr. et al. |
| 4,152,824 A | 5/1979 | Gonsiorawski |
| 4,219,448 A | 8/1980 | Ross |
| 4,308,091 A | 12/1981 | Schmitt et al. |
| 4,478,879 A | 10/1984 | Baraona et al. |
| 4,623,751 A | 11/1986 | Kishi et al. |
| 4,717,591 A | 1/1988 | Acosta et al. |
| 4,927,770 A | 5/1990 | Swanson |
| 5,011,782 A | 4/1991 | Lamb et al. |
| 5,030,295 A | 7/1991 | Swanson et al. |
| 5,053,083 A | 10/1991 | Sinton |
| 5,057,439 A | 10/1991 | Swanson et al. |
| 5,198,385 A | 3/1993 | Devitt et al. |
| 5,223,112 A | 6/1993 | Tepman |
| 5,248,496 A | 9/1993 | Schuster et al. |
| 5,281,350 A | 1/1994 | Gimm et al. |
| 5,401,336 A | 3/1995 | Noguchi et al. |
| 5,698,451 A | 12/1997 | Hanoka |
| 5,705,828 A | 1/1998 | Noguchi et al. |
| 5,897,368 A | 4/1999 | Cole, Jr. et al. |
| 5,939,336 A | 8/1999 | Yates |
| 6,020,250 A | 2/2000 | Kenney |
| 6,036,741 A | 3/2000 | Shindo et al. |
| 6,066,267 A | 5/2000 | Rath et al. |
| 6,082,610 A | 7/2000 | Shangguan et al. |
| 6,091,099 A | 7/2000 | Kiyotoshi et al. |
| 6,096,968 A | 8/2000 | Schlosser et al. |
| 6,103,393 A | 8/2000 | Kodas et al. |
| 6,290,880 B1 | 9/2001 | Ryan et al. |
| 6,328,913 B1 | 12/2001 | Shaffer et al. |
| 6,451,665 B1 | 9/2002 | Yunogami et al. |
| 6,458,183 B1 | 10/2002 | Phillips et al. |
| 6,537,461 B1 | 3/2003 | Nakahara et al. |
| 6,552,414 B1 | 4/2003 | Horzel et al. |
| 6,586,161 B2 | 7/2003 | Futase et al. |
| 6,607,988 B2 | 8/2003 | Yunogami et al. |
| 6,649,091 B2 | 11/2003 | Ryan et al. |
| 6,649,211 B2 | 11/2003 | Lyons et al. |
| 6,695,903 B1 | 2/2004 | Kubelbeck et al. |
| 6,737,221 B2 | 5/2004 | Futase et al. |
| 6,753,133 B2 | 6/2004 | Ono et al. |
| 6,800,542 B2 | 10/2004 | Kim |
| 6,825,104 B2 | 11/2004 | Horzel et al. |
| 6,852,635 B2 | 2/2005 | Satta et al. |
| 6,998,288 B1 | 2/2006 | Smith et al. |
| 7,008,517 B2 | 3/2006 | Feltsman |
| 7,129,109 B2 | 10/2006 | Munzer et al. |
| 7,135,350 B1 | 11/2006 | Smith et al. |
| 7,242,632 B2 | 7/2007 | Hiraka |
| 7,375,378 B2 | 5/2008 | Manivannan et al. |
| 7,432,438 B2 | 10/2008 | Rubin et al. |
| 7,510,672 B2 | 3/2009 | McCulloch et al. |
| 2002/0041991 A1 | 4/2002 | Chan et al. |
| 2002/0176927 A1 | 11/2002 | Kodas et al. |
| 2002/0184969 A1 | 12/2002 | Kodas et al. |
| 2003/0134469 A1 | 7/2003 | Horzel et al. |
| 2003/0207214 A1 | 11/2003 | Futase et al. |
| 2004/0013799 A1 | 1/2004 | Kim et al. |
| 2004/0063326 A1 | 4/2004 | Szlufcik et al. |
| 2004/0112426 A1 | 6/2004 | Hagino |
| 2004/0126644 A1 | 7/2004 | Bett et al. |
| 2004/0159869 A1 | 8/2004 | Rinerson et al. |
| 2005/0009346 A1 | 1/2005 | Miyajima |
| 2005/0062041 A1 | 3/2005 | Terakawa et al. |
| 2005/0089748 A1 | 4/2005 | Ohlsen et al. |
| 2005/0110125 A1 | 5/2005 | Blackshear |
| 2005/0224968 A1 | 10/2005 | Ho |
| 2005/0238808 A1 | 10/2005 | Gatineau et al. |
| 2005/0247674 A1 | 11/2005 | Kubelbeck et al. |
| 2006/0174933 A1 | 8/2006 | Rolison et al. |
| 2006/0255340 A1 | 11/2006 | Manivannan et al. |
| 2006/0283496 A1 | 12/2006 | Okamoto et al. |
| 2006/0283499 A1 | 12/2006 | Terakawa et al. |
| 2007/0099806 A1 | 5/2007 | Stewart et al. |
| 2007/0111354 A1 | 5/2007 | Seong et al. |
| 2007/0148336 A1 | 6/2007 | Bachrach et al. |
| 2007/0151599 A1 | 7/2007 | Cousins |
| 2007/0181908 A1 | 8/2007 | Otremba |
| 2007/0194467 A1 | 8/2007 | Yang et al. |
| 2007/0256728 A1 | 11/2007 | Cousins |
| 2008/0145708 A1 | 6/2008 | Heil et al. |
| 2008/0152835 A1 | 6/2008 | Mayers et al. |
| 2008/0210660 A1 | 9/2008 | Stockum et al. |
| 2009/0008787 A1 | 1/2009 | Wenham et al. |
| 2009/0068783 A1 | 3/2009 | Borden |
| 2009/0142880 A1 | 6/2009 | Weidman et al. |
| 2011/0315210 A1* | 12/2011 | Hang et al. .............. 136/256 |

FOREIGN PATENT DOCUMENTS

| | | |
|---|---|---|
| JP | 2009-533864 | 9/2009 |
| JP | 2010-526414 | 7/2010 |
| WO | WO-2009-032429 | 3/2009 |

OTHER PUBLICATIONS

International Search Report and Written Opinion of the International Searching Authority mailed Apr. 22, 2013 in PCT/US2013/020044.

* cited by examiner

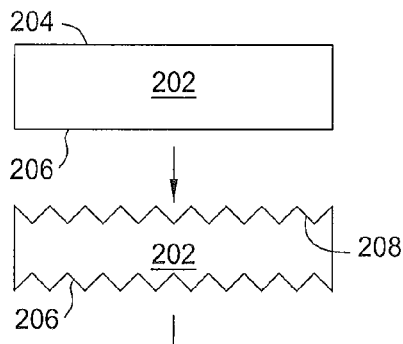
FIG. 2A
FIG. 2B
FIG. 2C
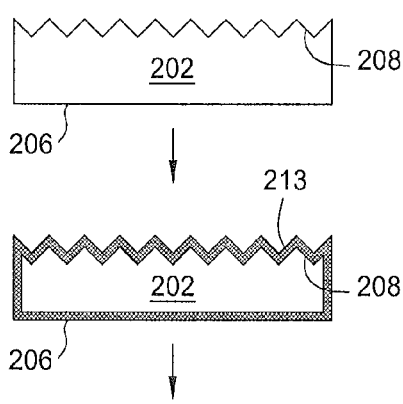
FIG. 2D
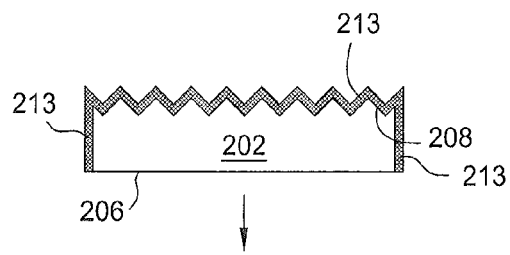
FIG. 2E
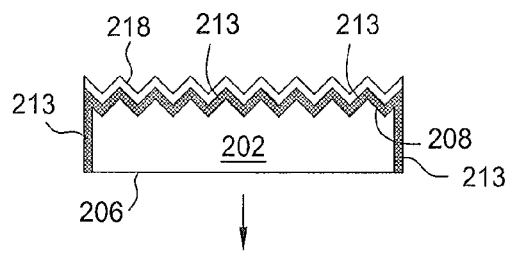
FIG. 2F
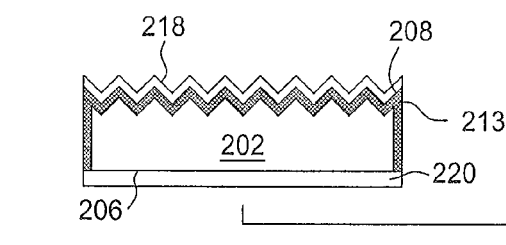
FIG. 2G
TO FIG. 2H

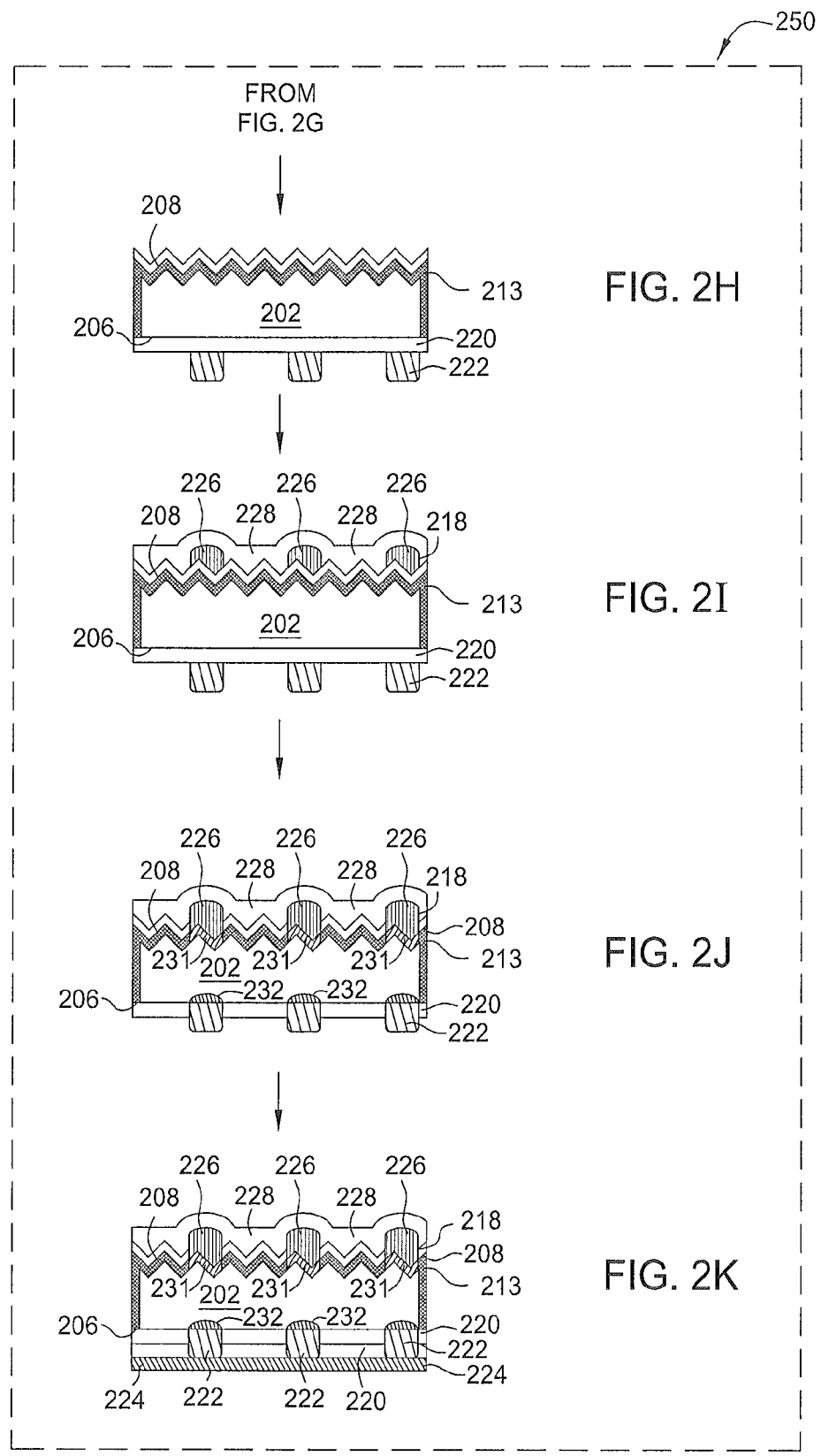

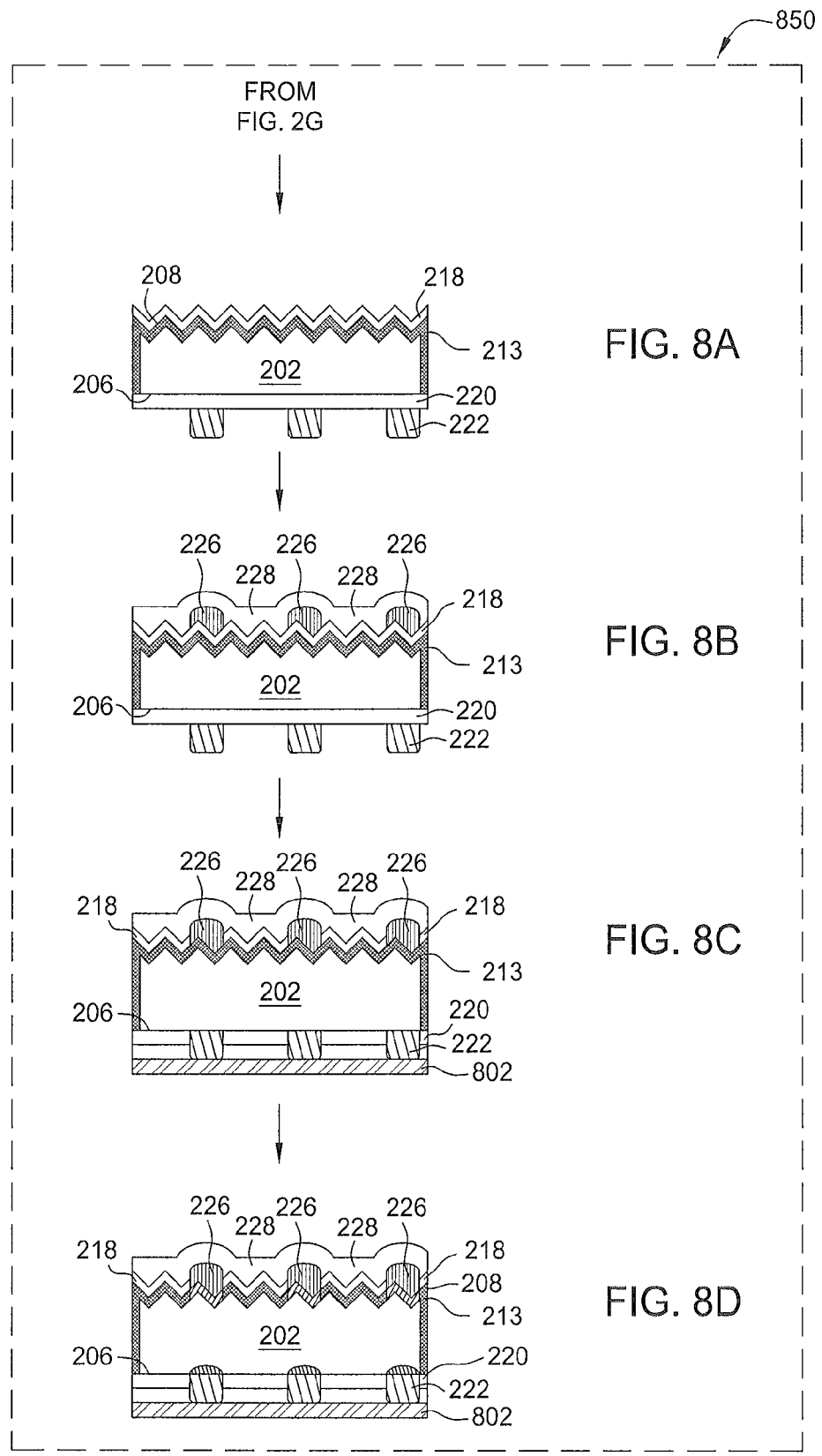

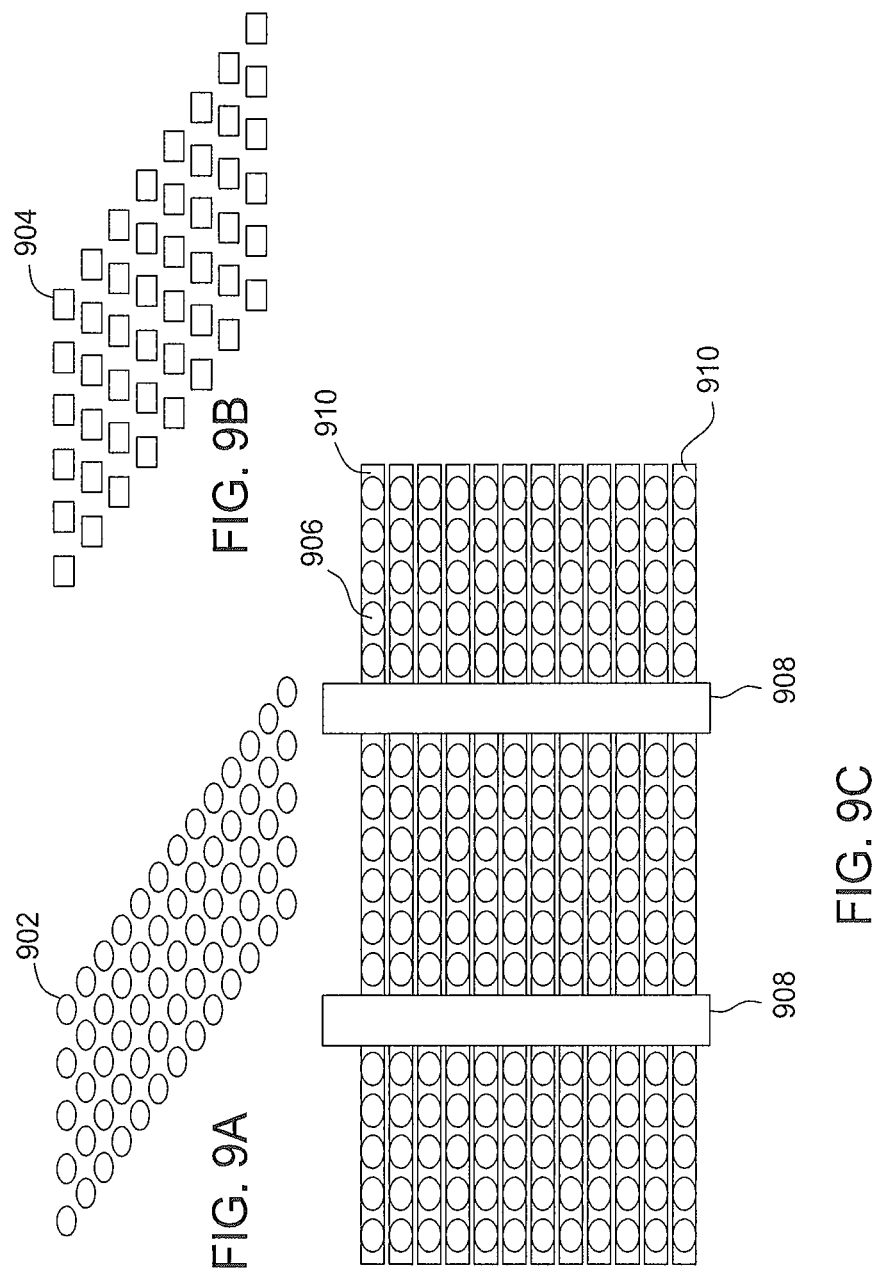

METHODS OF MANUFACTURING SOLAR CELL DEVICES

CROSS-REFERENCE TO RELATED APPLICATION

This application claims benefit of U.S. Provisional Application Ser. No. 61/585,926 filed Jan. 12, 2012, which is incorporated by reference in its entirety.

BACKGROUND OF THE INVENTION

1. Field of the Invention

Embodiments of the present invention generally relate to a process for forming crystalline solar cells.

2. Description of the Related Art

Solar cells are photovoltaic devices that convert sunlight directly into electrical power. The most common solar cell material is silicon, which is in the form of single or multicrystalline substrates, sometimes referred to as wafers. Because the amortized cost of forming silicon-based solar cells to generate electricity is higher than the cost of generating electricity using traditional methods, there has been an effort to reduce the cost required to form solar cells.

There are various approaches for fabricating the active regions and the current carrying metal lines, or conductors, of the solar cells. Manufacturing high efficiency solar cells at low cost is the key for making solar cells more competitive for the generation of electricity for mass consumption. The efficiency of solar cells is directly related to the ability of a cell to collect charges generated from absorbed photons in the various layers. A good passivation layer can provide a desired film property that reduces recombination of the electrons or holes in the solar cells and redirects electrons and charges back into the solar cells to generate photocurrent. When electrons and holes recombine, the incident solar energy is re-emitted as heat or light, thereby lowering the conversion efficiency of the solar cells.

A passivation layer disposed on a back surface of solar cell devices may be a dielectric layer providing good interface properties that reduce the recombination of the electrons and holes, drives and/or diffuses electrons and charge carriers back to junction regions formed in the substrate and minimize light absorption. Furthermore, the passivation layer disposed on the back surface of the solar cell devices may also serve as a backside reflector to minimize light absorption while assisting reflecting light back to the solar cell devices. In conventional practice, the passivation layer may be etched, drilled and/or patterned to form openings (e.g., back contact through-holes) that allow portions of the blanket back contact metal layer to extend through the passivation layer to form an electrical contact with the active regions of the device. Furthermore, conventional passivation layer processing sequences, which typically include laser ablation of the passivation layer steps, post laser processing cleaning steps, and blanket rear surface metal deposition steps, are costly, require a large number of processing steps and can create undesirable contamination that can inadvertently damage the solar cell devices.

Therefore, there exists a need for an improved method and apparatus to manufacture solar cell devices that have a desirable device performance as well as a low manufacture cost.

SUMMARY OF THE INVENTION

Embodiments of the present invention may provide a method of manufacturing a solar cell device, comprising providing a substrate having a first dielectric layer disposed on a first side of the substrate and a second dielectric layer disposed on a second side of the substrate, selectively disposing a first metal paste in a first pattern on at least a portion of the first dielectric layer, selectively disposing a second metal paste in a second pattern on a surface of the second dielectric layer, wherein the second dielectric layer is disposed between the portions of the second metal paste and the second side of the substrate, and simultaneously heating the first and the second metal pastes disposed on the first and the second dielectric layers to form a first group of contacts in the first dielectric layer and a second group of contacts in the second dielectric layer, wherein at least a portion of the second metal paste forms a plurality of contact regions that each extend through the second dielectric layer from the surface of the second dielectric layer to the second side of the substrate. In some configurations, the method may also include coupling a conductive layer to the contact regions formed in the second dielectric layer, wherein the conductive layer comprises an aluminum, copper or tin foil that helps to interconnect the formed contact regions and acts as a rear surface reflector.

Embodiments of the present invention are directed to the improved process for making solar cells. In one embodiment, a method for manufacturing solar cell devices in a substrate includes providing a substrate having a first dielectric layer disposed on a first side of the substrate and a second dielectric layer disposed on a second side of the substrate, selectively disposing a first group of contact metal paste on the first dielectric layer and a second group of contact metal paste on the second dielectric layer, simultaneously firing the first group and the second group of the contact metal paste disposed on the first and the second dielectric layer to etch through the first and the second dielectric layer respectively, forming a first group of contact openings in the first dielectric layer and a second group of contact opening in the second dielectric layer, forming a first group of metal contact structures in the first group of contact opening formed in the first dielectric layer formed through the first group of contact metal paste and forming a second group of metal contact structures in the second group of contact opening formed in the second dielectric layer formed through the second group of contact metal paste during the firing process.

In another embodiment, a method for manufacturing solar cell devices in a substrate includes providing a substrate having a first dielectric layer disposed on a first side of the substrate and a second dielectric layer disposed on a second side of the substrate, wherein the second dielectric layer has a first layer disposed on a second layer disposed on the second side of the substrate, selectively disposing a first metal paste in a first pattern on at least a portion of the first dielectric layer, performing a laser removal process to remove a portion of the first layer from the second side of the substrate to form openings in the first layer of the second dielectric layer, selectively disposing a second metal paste in a second pattern on a first layer of the second dielectric layer, portion of the second metal paste filling in the openings of the first layer disposing on the second layer of the second dielectric layer, simultaneously heating the first and the second metal pastes disposed on the first and the second dielectric layers to form a first group of contacts in the first dielectric layer and a second group of contacts in the second dielectric layer, wherein at least a portion of the second metal paste forms a plurality of contact regions that each extend through the second dielectric layer from the surface of the second dielectric layer to the second side of the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 2A-2K depict cross-sectional views of a solar cell substrate during different stages using a processing sequence of FIG. 1 according to one embodiment of the invention;

FIGS. 8A-8D depict cross-sectional views of a solar cell substrate during different stages using a processing sequence of FIG. 5 according to another embodiment of the invention; and FIGS. 9A-9C illustrate various patterns in which a metal paste layer may be disposed on a surface of a solar cell substrate according to another embodiment of the invention.

DETAILED DESCRIPTION

Embodiments of the present invention are directed to processes for making solar cells. Particularly, embodiments of the invention provide simultaneously co-firing (e.g., thermally processing) metal layers disposed both on a first and a second surface of a solar cell substrate to complete the metallization process in one step. By doing so, both the metal layers formed on the first and the second surfaces of the solar cell substrate are co-fired (e.g., simultaneously thermally processed), thereby eliminating manufacturing complexity, cycle time and cost to produce the solar cell device. Embodiments of the invention may also provide a method and solar cell structure that requires a reduced amount of a metallization paste on a rear surface of the substrate to form a rear surface contact structure and, thus, reduce the cost of the formed solar cell device.

One skilled in the art will appreciate that as the manufacturing cost of the solar cell substrate, which is typically the largest portion of a crystalline solar substrate manufacturing cost, decreases, due to the advancements in the process of forming the crystalline silicon ingots and the wire sawing processes used to form the substrates from the ingots, the cost of the other materials used to form a solar cell device become a larger portion of the solar cell's total manufacturing cost. It has been found that conventional "flood printing," or blanket metal paste layers deposited across large portions of the rear surface of the substrate, account for a significant portion of the total cost of forming a conventional solar cell device. Embodiments of the invention disclosed herein thus propose a method of reducing the amount of metal paste used to form the rear contact structure on a solar cell device, reduce the number of processing steps required to form a solar cell device and reduce the solar cell fabrication process sequence complexity. In one example, the methods described herein can reduce the amount of metal paste used to form a solar cell device by between about 60% and 99.6% over a conventional blanket deposited metal paste layer containing solar cell device.

Figure 1:
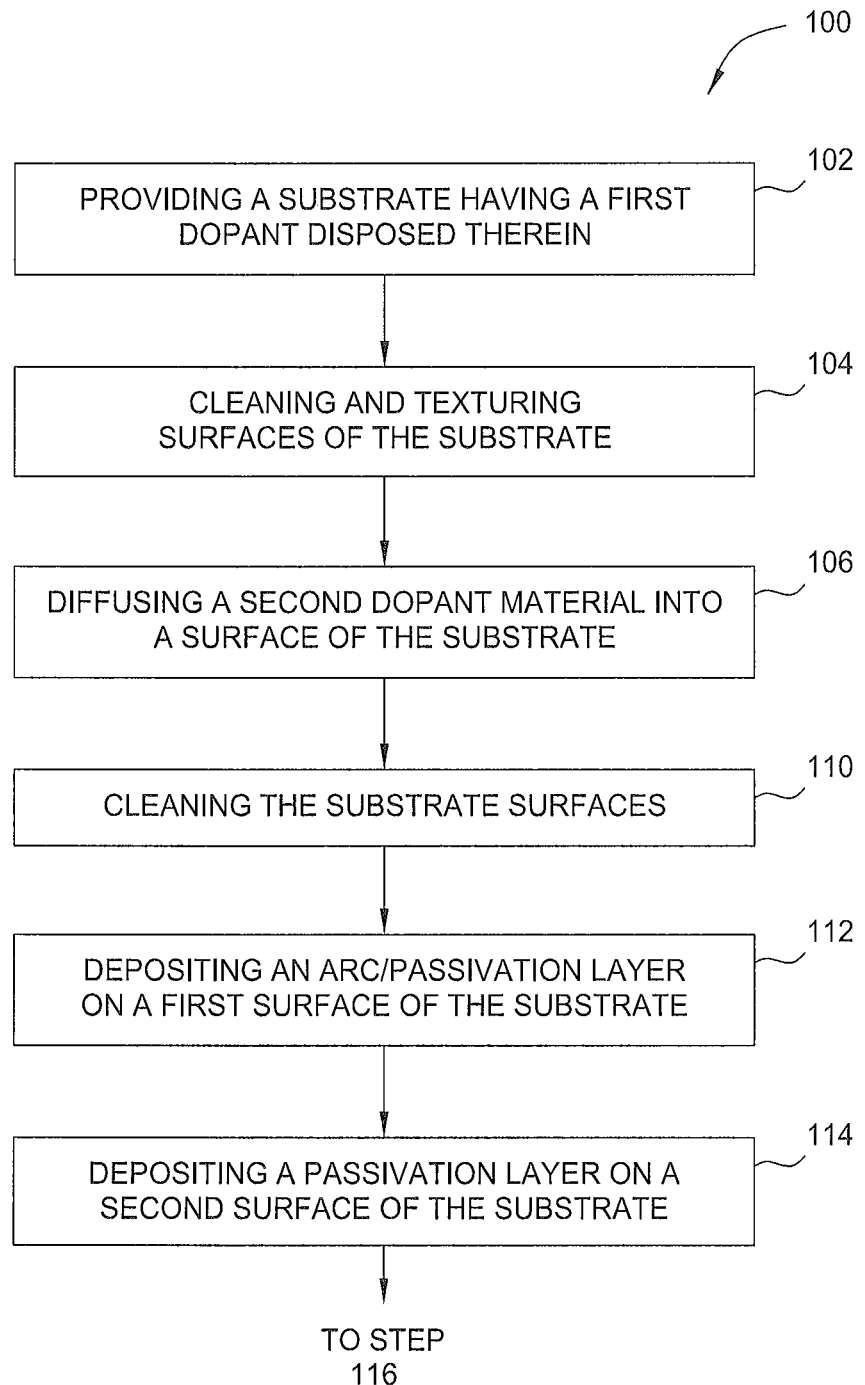
FIG. 1 depicts a block diagram of a processing sequence used to form solar cell devices in accordance with one embodiment of the present invention.
Figure 1:
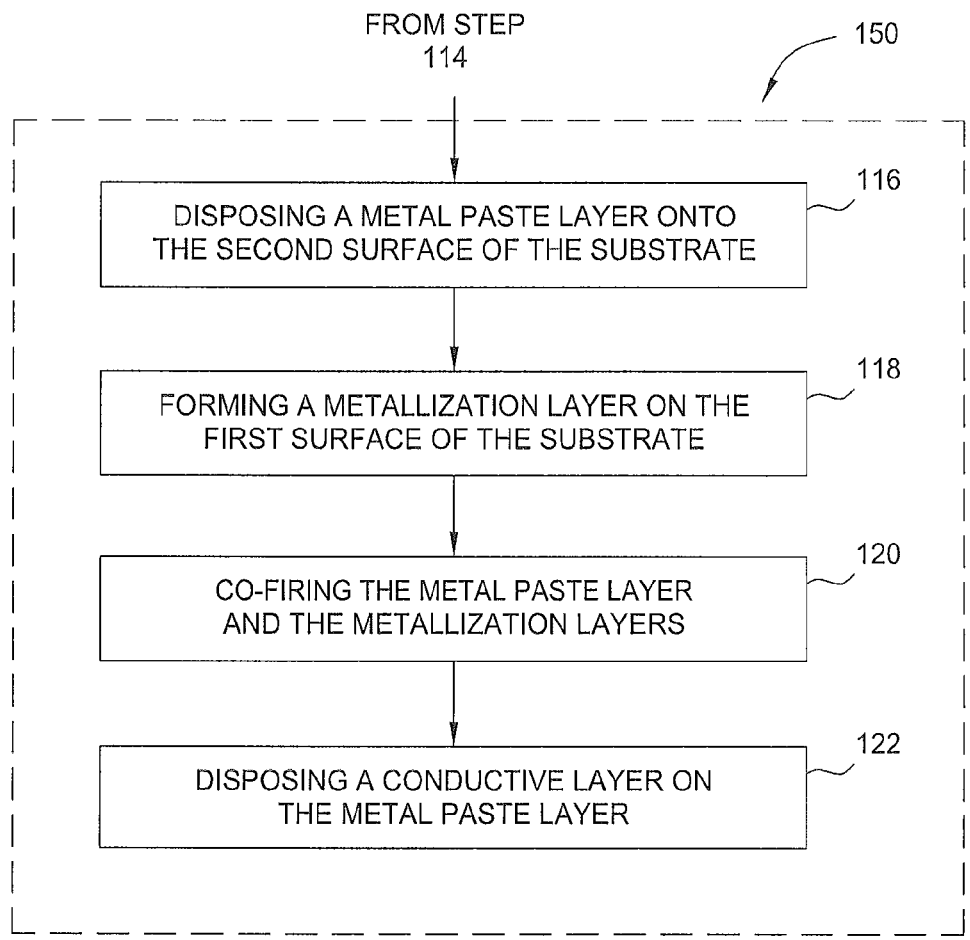

FIG. 1 depicts a block diagram of a processing sequence used to form a solar cell device in accordance with one embodiment of the present invention. FIGS. 2A-2K depict cross-sectional views of a solar cell substrate during different stages using a processing sequence of FIG. 1 according to one embodiment of the invention. It is noted that the processing sequences depicted in FIGS. 1 and 2A-2K are only used as an example of a process flow that can be used to manufacture a solar cell device. Additional steps may be added in between the steps depicted in FIG. 1 as needed to form a desirable solar cell device. Similarly, some steps depicted herein may also be eliminated as needed. It is contemplated that one or more metal or dielectric layers formed on a front or a back side of a substrate may be formed at any desired stage as needed.

In the embodiment, as depicted in FIGS. 1 and 2A, the process starts at step 102 by providing a substrate 202 having dopants disposed in one or more surfaces of the substrate 202. The substrate 202 may be a single crystal or multicrystalline silicon substrate, silicon containing substrate, doped silicon containing substrate, or other suitable substrates. In one embodiment, the substrate 202 is a doped silicon containing substrate with either p-type dopants or n-type dopants disposed therein. In one configuration, the substrate 202 is a p-type crystalline silicon (c-Si) substrate. P-type dopants used in silicon solar cell manufacturing are chemical elements, such as, boron (B), aluminum (Al) or gallium (Ga). In another configuration, the crystalline silicon substrate 202 may be an electronic grade silicon substrate or a low lifetime, defect-rich silicon substrate, for example, an upgraded metallurgical grade (UMG) crystalline silicon substrate. The upgraded metallurgical grade (UMG) silicon is a relatively clean polysilicon raw material having a low concentration of heavy metals and other harmful impurities, for example in the parts per million range, but which may contain a high concentration of boron or phosphorus, depending on the source. In certain applications, the substrate can be a back-contact silicon substrate prepared by emitter wrap through (EWT), metallization wrap around (MWA), or metallization wrap through (MWT) approaches. Although the embodiment depicted herein and relevant discussion thereof primarily discuss the use of a p-type c-Si substrate, this configuration is not intended to be limiting as to the scope of the invention, since an n-type c-Si substrate may also be used without deviating from the basic scope of the embodiments of the invention described herein. The doping layers or emitters formed over the substrate will vary based on the type of substrate that is used, as will be discussed below.

At step 104, the substrate 202 is cleaned and textured. The cleaning process cleans surfaces 204, 206 of the substrate 202 to remove any undesirable materials and then the texturing process roughens the first surface 204 of the substrate 202 to form a textured surface 208, as shown in FIG. 2B. The substrate 202 has the first surface 204 (e.g., a front surface) and the second surface 206 (e.g., a back surface), which is generally opposite to the first surface 204 and on the opposite side of the substrate 202. The substrate 202 may be cleaned using a wet cleaning process in which they are sprayed with a cleaning solution. The cleaning solution may be any conventional cleaning solution, such as HF-last type cleaning solution, ozonated water cleaning solution, hydrofluoric acid (HF) and hydrogen peroxide ($H_2O_2$) solution, or other suitable cleaning solution. The cleaning process may be performed on the substrate 202 for between about 5 seconds and about 600 seconds, such as about 120 seconds.

The textured surface 208 on the front side of the solar cell substrate 202 is adapted to receive sunlight after the solar cell has been formed. The textured surface 208 is formed to enhance light trapping in the solar cells to improve conversion efficiency. The second surface 206 of the substrate 202 may be textured during the texturing process as well. In one example, the substrate 202 is etched in an etching solution comprising between about 2.7% by volume of potassium hydroxide (KOH) and about 4500 ppm of 300 MW PEG that is maintained at a temperature of about 79-80° C. for about 30 minutes. In one embodiment, the etching solution for etching a silicon substrate may be an aqueous potassium hydroxide (KOH), sodium hydroxide (NaOH), aqueous ammonia ($NH_4OH$), tetramethylammonium hydroxide (TMAH; or $(CH_3)_4NOH$), or other similar basic solution. The etching solution will generally anisotropically etch the substrate 202, forming pyramids on the textured surfaces 208 and 209 of the substrate 202.

In some embodiments of step 104, a rear surface polishing step may be performed to reduce or eliminate the surface texture formed on the surface 206 of the substrate 202 so that a relatively flat and stable rear surface 206 can be formed, as shown in FIG. 2C. The rear surface polishing process may be performed using a chemical mechanical polishing (CMP) process or other similar method that can remove the surface roughness created during the texturing process. In some embodiments of the invention, the rear surface polishing process is completed after performing one or more of the following process steps, such as after performing step 106.

At step 106, as shown in FIG. 2D, a dopant material, such as a doping gas, is used to form a doped region 213 (e.g., $p^+$ or $n^+$ doped region) on the surface of the solar cell substrate. In one embodiment, the doped region 213 is formed in the substrate 202 by use of a gas phase doping process. In one embodiment, the doped region 213 is between about 50 Å and about 20 μm thick and comprises an n-type or p-type dopant atom. In one embodiment, the doped region 213 may be an n-type dopant that is disposed in a p-type substrate 202.

In one embodiment, at step 106, dopants in a doping gas are diffused into the substrate to form the doped region 213. In one example, phosphorus dopant atoms from the doping gas are doped into the surface of the substrate 202 by use of a phosphorous oxychloride ($POCl_3$) diffusion process that is performed at a relatively high processing temperature. In one example, the substrate 202 is heated to a temperature greater than about 800° C. in the presence of a dopant containing gas to causes the doping elements in the dopant containing gas to diffuse into the surfaces of the substrate to form a doped region. In one embodiment, the substrate is heated to a temperature between about 800° C. and about 1300° C. in the presence of phosphorus oxychloride ($POCl_3$) containing gas for between about 1 and about 120 minutes. Other examples of dopant materials may include, but are not limited to polyphosphoric acid, phosphosilicate glass precursors, phosphoric acid ($H_3PO_4$), phosphorus acid ($H_3PO_3$), hypophosphorous acid ($H_3PO_2$), and/or various ammonium salts thereof. In embodiments where the substrate 202 is an n-type substrate, the doped region 213 may be a p-type dopant material, such as boric acid ($H_3BO_3$). The processes performed during step 106 may be performed by any suitable heat treatment module. In one embodiment, the heat treatment module is a rapid thermal annealing (RTA) chamber, annealing chamber, a tube furnace or belt furnace chamber.

In an alternate embodiment of step 106, the doped region 213 may be formed by depositing or printing a dopant material in a desired pattern on the surface of the substrate 202 by the use of screen printing, ink jet printing, spray deposition, rubber stamping, laser diffusion or other similar process and then the driving the dopant atoms in the dopant material into the surface of the substrate. The doped region 213 may initially be a liquid, paste, or gel that is used to form heavily doped regions in the substrate 202. The substrate 202 is then heated to a temperature greater than about 800° C. to cause the dopants to drive-in or diffuse into the surface of the substrate 202 to form the doped region 213 shown in FIG. 2D. In one embodiment, the drive-in process is performed by heating the substrate 202 to a temperature between about 800° C. and about 1300° C. for a desired period of time, for example, about 1 minute to 120 minutes. The drive-in process may be performed by any suitable heat treatment module.

After the forming the doped region 213, the substrate 202 may be gradually cooled to a desired temperature. The temperature of the substrate 202 may be ramped down at rampdown rate between about 5° C./sec. and about 350° C./sec. from the diffusion temperature of about 850° C. to a desired temperature of about 700° C. or less, such as about room temperature.

At step 110, a cleaning process may be optionally performed on the substrate 202 to remove any undesirable residues or oxides, such as phosphosilicate glass (PSG) layers, formed during step 106 or other previous processing steps, from the substrate 202. The clean process may be performed in a similar fashion discussed above with respect to step 104. The clean process may be performed on the substrate 202 between about 5 seconds and about 600 seconds, such as about 30 seconds to about 240 seconds.

It is noted that the doped region 213 formed on the rear surface 206 of the substrate 202 may be polished away as needed for different process requirements, as shown in FIG. 2E. The rear surface 206 may be optionally etched to remove the portion of the doped region 213 disposed thereon. The etching process may be performed in a similar fashion discussed above with respect to step 104, and may comprise applying a wet chemistry to the rear surface to selectively remove the doped region 213. Alternatively, the etching process may be a dry etching process. Such as a isotropic etching, a remote or direct plasma from $NF_3$, $SF_6$, $F_2$, $NCl_3$, $Cl_2$, or a vapor comprising HF and $O_3$, combinations thereof or other suitable gas species, to remove undesired contaminates and residuals from the rear surface 206 as needed.

At step 112, an antireflection layer or passivation layer 218 is formed on the front textured surface 208 of the substrate 202, as shown in FIG. 2F. The antireflection layer/passivation layer 218 may optionally include a transparent conductive oxide (TCO) layer (not shown) as needed. In one example, the antireflection layer/passivation layer 218 may be a thin antireflection/passivation layer, such as silicon oxide or silicon nitride. In one embodiment, the passivation/ARC layer 218 may be a film stack may comprise a first layer that is in contact with the front textured surface 208 and a second layer that is disposed on the first layer. In one example, the first layer may comprise a silicon nitride (SiN) layer formed by a plasma enhanced chemical vapor deposition (PECVD) process that is between about 50 Angstroms (Å) and about 350 Å thick, such as 150 Å thick, and has a desirable quantity ($Q_1$) of trapped charge formed therein, to effectively passivate the substrate surface. In one example, the second layer may comprise a silicon nitride (SiN) layer formed by a PECVD process that is between about 400 Å and about 700 Å thick, such as 600 Å thick, which may have a desirable quantity ($Q_2$) of trapped charge formed therein, to effectively help bulk passivate the substrate surface. One will note that the type of charge, such as a positive or negative net charge based on the sum of $Q_1$ and $Q_2$, is preferentially set by the type of substrate over which the passivation layers are formed. However, in one example, a total net positive charge of between about $5 \times 10^{11}$ Coulombs/$cm^2$ to about $1 \times 10^{13}$ Coulombs/$cm^2$ is desirably achieved over an n-type substrate surface, whereas a total net negative charge of between about $5 \times 10^{11}$ Coulombs/$cm^2$ to about $1 \times 10^{13}$ Coulombs/$cm^2$ would desirably be achieved over a p-type substrate surface. Alternately, in certain embodiments where a heterojunction type solar cell is desired, the antireflection/passivation layer 218 may include a thin (20-100 Å) intrinsic amorphous silicon (i-a-Si:H) layer followed by an ARC layer (e.g., silicon nitride), which can be deposited using a physical vapor deposition (PVD) process or a chemical vapor deposition (CVD) process.

At step 114, a back side passivation layer 220 is deposited on the second surface 206 (e.g., back surface) of the substrate 202, as shown in FIG. 2G. The passivation layer 220 may be a dielectric layer providing good interface properties that reduce the recombination of the electrons and holes, drives and/or diffuses electrons and charge carriers. In one embodiment, the passivation layer 220 may be fabricated from a dielectric material selected from a group consisting of silicon nitride ($Si_3N_4$), silicon nitride hydride ($Si_xN_y$:H), silicon oxide, silicon oxynitride, a composite film of silicon oxide and silicon nitride, an aluminum oxide layer, a tantalum oxide layer, a titanium oxide layer, or any other suitable materials. In one embodiment, the passivation layer 220 utilized herein is an aluminum oxide layer ($Al_xO_y$). The aluminum oxide layer ($Al_xO_y$) may be formed by any suitable deposition techniques, such as atomic layer deposition (ALD) process, plasma enhanced chemical vapor deposition (PECVD) process, metal-organic chemical vapor deposition (MOCVD), sputter process or the like. In an exemplary embodiment, the passivation layer 220 is an aluminum oxide layer ($Al_xO_y$) is formed by a MOCVD or ALD process having a thickness between about 5 nm and about 120 nm.

At step 116, back contact metal paste 222 is selectively deposited on the passivation layer 220 to form back metal contacts by use of an ink jet printing, rubber stamping, stencil printing, screen printing, or other similar process to form and define a desired pattern where electrical contacts to the underlying substrate surface (e.g., silicon) are formed, as depicted in FIG. 2H. In one embodiment, the back contact metal paste 222 is disposed in a desirable pattern on the passivation layer 220 by a screen printing process in which the back contact metal paste 222 is printed on passivation layer 220 through a stainless steel screen. In one example, the screen printing process may be performed in a SoftLine™ system available from Applied Materials Italia S.r.I., which is a division of Applied Materials Inc. of Santa Clara, Calif. It is also contemplated that deposition equipment from other manufactures may also be utilized.

The back contact metal paste 222 may include polymer resin having metal particles disposed therein. The polymer and particle mixture is commonly known as "pastes" or "inks". The polymer resins act as a carrier to help enable printing of the back contact metal paste 222 onto the passivation layer 220. Other organic chemicals are added to tune the viscosity, surface wetting, or other properties of the paste. The polymer resin and other organics are removed from the passivation layer 220 or from the substrate 202 during the subsequent firing process, which will be discussed further detail below. Glass frits may also be included in the back contact metal paste 222. Chemical compounds contained in the glass frits found in the back contact metal paste 222 will react with the passivation layer 220 materials disposed on the substrate 202 to allow the metallic elements, and other components of the paste, to diffuse (e.g., firing through) into the passivation layer 220 and form a contact with the substrate surface, as well as facilitating coalescence of the metal particles in the paste and passivation layer to form a conductive path through the passivation layer. Glass frits thus enable the contact metal paste 222 to pattern the passivation layer 220, thus allowing the metal particles in the passivation layer 220 to form electrical contacts through the passivation layer 220. In one embodiment, metal particles found in the contact metal paste 222 may be selected from silver, silver alloy, copper (Cu), tin (Sn), cobalt (Co), rhenium (Rh), nickel (Ni), zinc (Zn), lead (Pb), and/or aluminum (Al), or other suitable metals to provide a proper conductive source for forming electrical contacts to the substrate surface through the passivation layer 220. Additional components in the back contact metal paste are generally selected so as to promote effective "wetting" of the passivation layer 220 while minimizing the amount of spreading that can affect the formed feature/contact metal patterns in the passivation layer 220.

In one embodiment, the back contact metal paste 222 includes aluminum (Al) particles disposed in a polymer resin that is used to form electrical contacts and back-surface-field (BSF) regions on the rear surface of a p-type substrate. In some configurations, the aluminum paste may also include aluminum particles and a glass frit disposed therein to form aluminum metal contacts through the passivation layer 220. In one embodiment, the aluminum paste is selected to facilitate the low temperature dissolution of aluminum oxide, found in the passivation layer 220, and the formation of aluminum silicon alloys during a subsequent metal contact co-firing process, which will be discussed below in detail. In some configurations, the aluminum paste includes aluminum and bismuth silicides, bismuth germinate, sodium hexafluoroaluminate (cryolite) or other chlorine or fluorine containing compounds that bond with aluminum to form a chemically active material that can fire-through the passivation layer 220 (e.g., aluminum oxide) and form an aluminum silicon alloy with regions of the p-type substrate 202 during a subsequent metal contact co-firing process. In one example, the formed pattern of metal paste features disposed on the passivation layer 220 include an aluminum paste that is disposed over an aluminum oxide passivation layer disposed on the rear surface 206 of the p-type substrate 202, wherein the patterned metal paste comprises an array of metal paste dots that are between about 50 μm and about 200 μm in size and between about 5 and 20 μm thick that are placed on between about 300 μm and 1500 μm centers over an aluminum oxide passivation layer that is between about 10 and 100 nm thick. The metal paste features may be formed in a hexagonal close packed (HCP) array, rectangular array or other desirable pattern. FIGS. 9A-9C illustrate some possible examples of other desirable patterns of the features formed on the rear surface 206 of the substrate 202. As noted above, in one example, the methods described herein can reduce the amount of metal paste used on the rear surface of the substrate by between about 60% and about 99.6% over a blanket deposited metal paste layer that is formed in a conventional solar cell device. One skilled in the art will also appreciate that the metal paste materials used herein will generally be significantly less expensive than the common metal pastes used in the industry that are specifically tailored to not "fire-through", or react with, the passivation layer materials they are disposed over.

At step 118, metallization layers, including front contact structures 226 and/or a conductive bus-line 228, are formed on the antireflection/passivation layer 218 on the front textured surface 208 of the substrate 202, as shown in FIG. 2I. The front contact structures 226 may be deposited in a desirable pattern on the surface of the antireflection/passivation layer 218 after the back contact metal paste 222 is disposed on the back surface 206 of the substrate 202. In some embodiments, vias may be formed through the antireflection/passivation layer 218 by use of an etching or ablation process so that portions of the front contact structures 226 and/or the conductive bus-line 228 that are disposed thereover can form good electrical contacts with the exposed potions of the doped region 213 formed on the front surface 204 of the substrate 202. In general, the front contact structures 226 may be between about 500 angstroms and about 50,000 angstroms (Å) thick, about 10 μm to about 200 μm wide, and contain a metal, such as aluminum (Al), silver (Ag), tin (Sn), cobalt (Co), rhenium (Rh), nickel (Ni), zinc (Zn), lead (Pb), palladium (Pd), molybdenum (Mo), titanium (Ti), vanadium (V), tungsten (W), or chromium (Cr). In one example, the front conductive contact 226 is a metallic paste that contains silver (Ag) and is deposited in a desired pattern by a screen printing process. The screen printing process may be performed by a Softline™ system available from Applied Materials Italia S.r.I., a division of Applied Materials, Inc. of Santa Clara, Calif.

In general, the conductive bus-line 228 is formed and attached to at least a portion of the front contact structures 226 to allow the solar cell device to be connected to other solar cells or external devices. In one embodiment, the conductive bus-line 228 is connected to the front contact structures 226 using a soldering material that may contain a solder material (e.g., Sn/Pb, Sn/Ag) if necessary. In one embodiment, the conductive bus-line 228 is about 200 microns thick and contains a metal, such as aluminum (Al), copper (Cu), silver (Ag), gold (Au), tin (Sn), cobalt (Co), rhenium (Rh), nickel (Ni), zinc (Zn), lead (Pb), palladium (Pd), and/or aluminum (Al). In one embodiment, each of the conductive bus-line 228 are formed from a wire that is about 30 gauge (AWG: ~0.254 mm) or smaller in size. In one embodiment, the conductive bus-line 228 is coated with a solder material, such as a Sn/Pb or Sn/Ag solder material.

At step 120, after the back contact metal paste 222 and the front contact structures 226, and the conductive bus-line 228, are formed on the back surface 206 and front textured surface 208, respectively, a thermal processing step (e.g., a co-firing process or called a "co-fire-through" metallization process) is performed to simultaneously cause the back contact metal paste 222 and the front contact structures 226, and the conductive bus-line 228, all at once to densify or sintered, cause at least the back contact metal paste 222 to fire-through the passivation layer 220, and form good electrical contacts with the silicon material found in the doped region 213 and back surface 206 of the substrate 202, respectively, as shown in FIG. 2J. During step 120, portions of the passivation layer 220 and/or the antireflection/passivation layer 218 are etched through during the co-firing process, by the back contact metal paste 222 and the front contact structures 226, to form front side electrical contact regions 231 and rear surface contact regions 232 that each extend through their respective passivation layer stacks 218, 220. After performing step 120, the regions of the patterned back contact metal paste 222 will densify and form a conductive path that is in electrical contact with the rear surface contact region 232 and extend through the passivation layer 220 so that these formed regions of patterned metal contacts, or conductive paths 242, can be subsequently connected together to form a back surface contact structure. Similarly, after performing step 120, the regions of the front contact structures 226 and the conductive bus-line 228 will densify and form a conductive path 241 that is in electrical contact with the front surface contact regions 231 and extend through the passivation layer 218 to form a front side contact structure. In one embodiment, the peak firing temperature may be controlled between about 600 degrees Celsius and about 900 degrees Celsius, such as about 800 degrees Celsius for short time period, such as between about 1 seconds and about 8 seconds, for example, about 2 seconds. The firing process will also assist in evaporating the polymer or etchant materials found in the back contact metal paste 222 and the front contact structures 226.

It is generally desirable for step 120, and other similar processing steps discussed below (e.g., steps 308, 506, 708), to be performed using a thermal process that is similar to a conventional front contact "firing" process to assure that the conventional front side metallization processes will not be affected by the addition of the back side contact formation during this "co-firing" step. To assure that the patterned back contact metal paste 222 will "fire-through" the passivation layer 220 during step 120, the thickness of the passivation layer 220, the passivation layer composition, the composition of the metal paste material and the mass of each of the patterned back contact metal paste "dots" may need to be adjusted to assure that a repeatable solar cell device formation process is achieved.

At step 122, a conductive layer 224 may be formed, coupled to and/or attached to at least a portion of the conductive paths 242 formed from the back contact metal paste 222 to form an inexpensive element/structure that interconnects the conductive paths 242 together and acts as a rear surface reflector so as to allow portions of the light passing through the substrate 202 to be reflected back into the substrate 202, as shown in FIG. 2K. The conductive layer 224 may be a monolithic piece of material such as an aluminum, copper or tin foil material, blanket deposited metal layer or other suitable metallic materials manufactured by any suitable deposition techniques, such as screen print process, atomic layer deposition (ALD) process, physical vapor deposition (PVD) process, plasma enhanced chemical vapor deposition (PECVD) process, metal-organic chemical vapor deposition (MOCVD), sputter process or the like. The conductive layer 224 may have a thickness between about 500 angstroms and about 50,000 angstroms (Å) thick, about 10 μm to about 200 μm wide, and contain a metal, such as aluminum (Al), silver (Ag), tin (Sn), cobalt (Co), rhenium (Rh), nickel (Ni), zinc (Zn), lead (Pb), palladium (Pd), molybdenum (Mo), titanium (Ti), vanadium (V), tungsten (W), or chromium (Cr). In one example, the conductive layer 224 comprises an aluminum (Al) containing foil material, such as a 1000 series aluminum foil material (Aluminum Association designation). The conductive layer 224 may also be a tin or copper foil material. In some cases, the conductive layer 224 is a foil material that is cut into a desired shape and/or pattern from a continuous roll of foil material. In some embodiments, the conductive layer 224 may comprise nickel, titanium, copper, silver or other useful conductive material that is plated or deposited on the surface of a foil material. In one example, the conductive layer 224 comprises a 50 μm thick sheet of 1145 aluminum that bonded to or coupled to the conductive paths 242 by use of a bonding step. In some embodiments, the conductive layer 224, such as a metal foil material, can be bonded to the conductive paths 242 by us of an electrically conductive adhesive (ECA) material, such as a metal filled epoxy, metal filled silicone or other similar polymeric material that has a conductivity that is high enough to conduct the electricity generated by the formed solar cell. In one example, the ECA has a resistivity that is less than about $1 \times 10^{-5}$ ohm-centimeters.

In one configuration, the conductive layer 224 is an inexpensive metallic paste that contains aluminum (Al) and is deposited by screen printing a metallic paste and heating the metallic paste to a desired temperature to sinter the paste. The screen printing process may be performed by a Softline™ system available from Applied Materials Italia S.r.I., a division of Applied Materials, Inc. of Santa Clara, Calif.

It is noted that steps 116 to 122, as indicated in the dotted line box 150, and the embodiments of the devices structures illustrated in FIGS. 2H to 2K, as indicated in the dotted line box 250, may be replaced to with a different set of process steps/process sequences to possibly enhance portions of the solar cell manufacturing process and/or form different solar cell structures, as will be further discussed below with referenced to FIGS. 3-9C, as needed to meet different device performance requirements or process need.

First Alternate Processing Sequence

Figure 3:
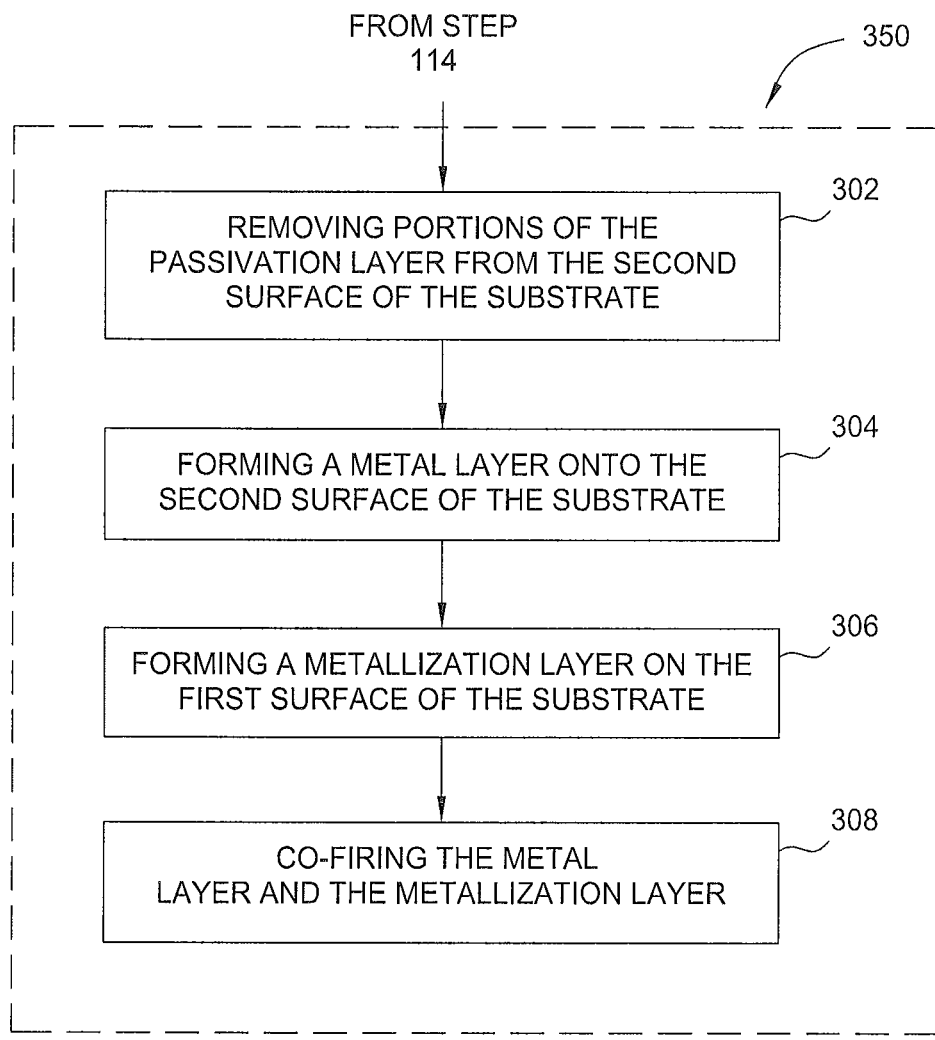
FIG. 3 depicts a block diagram of a processing sequence used to form solar cell devices in accordance with another embodiment of the present invention.
Figure 4:
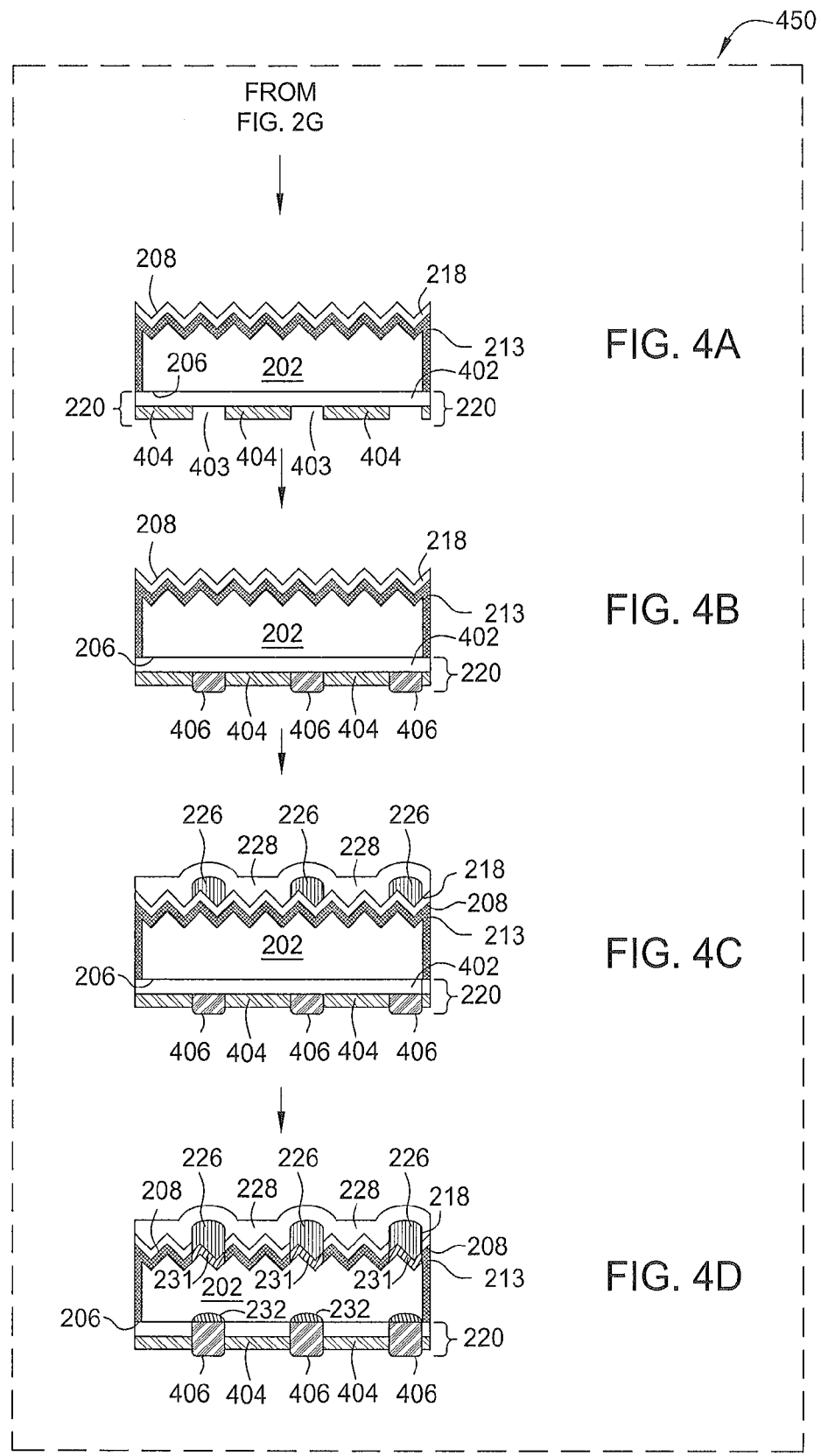
FIGS. 4A-4D depict cross-sectional views of a solar cell substrate during different stages using a processing sequence of FIG. 3 according to another embodiment of the invention.

FIG. 3 depicts a block diagram of a processing sequence used to form solar cell devices in accordance with another embodiment of the present invention. FIGS. 4A-4D depict cross-sectional views of a solar cell substrate during different stages using a processing sequence that is illustrated in FIG. 3 according to another embodiment of the invention. The process steps depicted in FIG. 3, from step 302 to step 308, are performed after steps 102 to 114 (FIG. 1) have been performed, and replace steps 116-122, which are illustrated in the box 150, with these new steps 302-308 shown in the box 350. The structures depicted in FIGS. 4A-4D are manufactured after the structure illustrated in FIG. 2G (step 114) has been formed, and thus the structures illustrated in FIGS. 2H-2K, and shown in the box 250, are replaced with the structures depicted in FIGS. 4A-4D found in box 450. FIGS. 4A-4D are cross sectional views of a solar cell device during the different processing steps performed within the processing sequence found in box 350, which include steps 302-308 depicted in FIG. 3.

At step 302, after the passivation layer 220 is formed on the back surface 206 of the substrate 202, a laser patterning process is performed to form through-holes (e.g., openings) 403 through at least a portion of the passivation layer 220, as shown in FIG. 4A. In the embodiment, as depicted in FIG. 4A, the passivation layer 220 comprises a composite layer stack, having a first layer 402 disposed on the back surface 206 of the substrate 202 and a second layer 404 disposed on the first layer 402. In one configuration, the passivation layer 220 depicted in FIG. 4A is fabricated from a composite film in which the first and the second layers 402, 404 comprise a material selected from the group of silicon oxide, silicon nitride, aluminum oxide layer, tantalum oxide layer, titanium oxide layer, or any other suitable materials. In one embodiment, the passivation layer 220 comprises a first layer 402 that comprises aluminum oxide ($Al_xO_y$) and a second layer 404 that comprises silicon nitride ($Si_xN_y$). In this configuration, the aluminum oxide layer and the silicon nitride layer may also be formed by any suitable deposition techniques, such as atomic layer deposition (ALD) process, plasma enhanced chemical vapor deposition (PECVD) process, metal-organic chemical vapor deposition (MOCVD), sputter process or the like. In the exemplary embodiment depicted in FIG. 4A, the first layer 402 of the passivation layer 220 is an aluminum oxide layer ($Al_xO_y$) is formed by an ALD process having a thickness between about 5 nm and about 120 nm and the second layer 404 of the passivation layer 220 is a silicon nitride layer formed by a plasma enhanced chemical vapor deposition (PECVD) process having a thickness between about 5 nm and about 120 nm.

The laser patterning process may form the openings 403 in the second layer 404 of the passivation layer 220 to allows portions of the later deposited back metal contact material to be disposed therein. In one embodiment, the laser patterning process is performed by delivering a series of laser pulses in a desired pattern to portions of the second layer 404 of the passivation layer 220 to form a desired pattern of openings 403 there through. The bursts of laser pulse may have a laser of wavelength between about 180 nm and about 1064 nm, such as about 355 nm. Each pulse is focused or imaged to spots at certain regions of the second layer 404 of the passivation layer 220 to form openings 403 therein to at least expose portions of the first layer 402. Each opening 403 of the second layer 404 of the passivation layer 220 may be spaced at an equal distance to each other or other desired pattern. Alternatively, each opening 403 may be configured to have different distances to one and another or may be configured in any manner as needed.

In one embodiment, the spot size of the laser pulse is controlled at between about 5 μm and about 100 μm, such as about 25 μm. The spot size of the laser pulse may be configured in a manner to form spots in the second layer 404 of the passivation layer 220 with desired dimension and geometries. In one embodiment, a spot size of a laser pulse about 25 μm may form an opening in the second layer 404 of the passivation layer 220 with a diameter about 30 μm.

The laser pulse may have energy density (e.g., fluence) between about 15 microJoules per square centimeter (mJ/cm$^2$) and about 50 microJoules per square centimeter (mJ/cm$^2$), such as about 30 microJoules per square centimeter (mJ/cm$^2$) at a frequency between about 30 kHz and about 70 kHz. Each laser pulse length is configured to be about 80 nanoseconds. The laser pulse is continuously pulsed until the openings 403 are formed in the second layer 404 of the passivation layer 220 exposing the underlying first layer 402 of the substrate 202. In one embodiment, the laser may be continuously pulsed for between about 500 picoseconds and about 80 nanoseconds, such as about 50 nanoseconds. After a first opening, for example, is formed in a first position defined in the second layer 404 of the passivation layer 220, a second opening is then be consecutively formed by moving the laser pulse to direct to a second location where the second opening desired to be formed in the second layer 404 of the passivation layer 220 to continue performing the laser patterning process until a desired number of the openings 403 are formed in the second layer 404 of the passivation layer 220. During the laser patterning process, the substrate 202 may be heated by the laser energy provided to the substrate 202. In one embodiment, during the laser pattering process, the substrate 202 may locally teach a temperature between about 450 degrees Celsius and about 1000 degrees Celsius.

At step 304, a metal layer 406, such as a back contact metal paste which is discussed above, may be formed and disposed on at least a portion of second layer 404 of the passivation layer 220, as shown in FIG. 4B. The metal layer 406 may be formed by any suitable metallic materials manufactured by any suitable deposition techniques, such as screen print process, atomic layer deposition (ALD) process, physical vapor deposition (PVD) process, plasma enhanced chemical vapor deposition (PECVD) process, metal-organic chemical vapor deposition (MOCVD), sputter process or the like. The metal layer 406 as formed herein may assist in the formation of the conductive paths 242 in a portion of the passivation layer 220. The metal layer 406 may have a thickness between about 500 angstroms and about 50,000 angstroms (Å) thick, about 10 µm to about 200 µm wide, and contain a metal, such as aluminum (Al), silver (Ag), tin (Sn), cobalt (Co), rhenium (Rh), nickel (Ni), zinc (Zn), lead (Pb), palladium (Pd), molybdenum (Mo), titanium (Ti), vanadium (V), tungsten (W), or chromium (Cr). In one example, conductive metal line layer 406 is a metallic paste that contains aluminum (Al) and is deposited by screen printing a metallic paste as discussed above in conjunction with step 116 (FIG. 1). The screen printing process may be performed by a Softline™ tool available from Applied Materials Italia S.r.I., a division of Applied materials, Inc. of Santa Clara, Calif.

At step 306, similar to the processes performed at step 118 depicted in FIG. 1 and FIG. 2I, metallization layers, including the front contact structures 226 and/or the conductive bus-lines 228, are formed on the antireflection/passivation layer 218 on the front textured surface 208 of the substrate 202, as shown in FIG. 4C. The front contact structures 226 may be deposited in a pattern on the substrate 202, as discussed above. The front contact structures 226 may be between about 500 angstroms and about 50,000 angstroms (Å) thick, about 10 µm to about 200 µm wide, and contain a metal, such as aluminum (Al), silver (Ag), tin (Sn), cobalt (Co), rhenium (Rh), nickel (Ni), zinc (Zn), lead (Pb), palladium (Pd), molybdenum (Mo), titanium (Ti), vanadium (V), tungsten (W), or chromium (Cr). In one example, the front conductive contact 226 is a metallic paste that contains aluminum (Al) or silver (Ag).

The conductive bus-lines 228 disposed on the front contact structures 226 are formed and attached to at least a portion of the front contact structures 226 to allow portions of the solar cell device to be connected to other solar cells or external devices. In one embodiment, the conductive bus-line 228 is connected to the front contact structures 226 using a soldering material that may contain a solder material (e.g., Sn/Pb, Sn/Ag) if necessary. In one embodiment, the conductive bus-line 228 is about 200 microns thick and contains a metal, such as aluminum (Al), copper (Cu), silver (Ag), gold (Au), tin (Sn), cobalt (Co), rhenium (Rh), nickel (Ni), zinc (Zn), lead (Pb), palladium (Pd), and/or aluminum (Al). In one embodiment, each of the conductive bus-lines 228 are formed from a wire that is about 30 gauge (AWG: ~0.254 mm) or smaller in size. In one embodiment, the conductive bus-line 228 is coated with a solder material, such as a Sn/Pb or Sn/Ag solder material.

At step 308, similar to the processes performed at step 120 depicted in FIG. 1 and FIG. 2J, after the metal layer 406, the front contact structures 226 and the conductive bus-line 228 are all formed on both the front textured surface 208 and the back surface 206, a co-firing process (e.g., thermal processing step) may be performed to simultaneously thermally process the metal layer 406, the front contact structures 226 and the conductive bus-line 228 all at once, as shown in FIG. 4D. As discussed with referenced to the description of step 120, potions of the passivation layer 220 and/or the antireflection/passivation layer 218 may be etched through during the co-firing process, by the metal layer 406 and the front contact structures 226, to form front side electrical contact regions 231 and rear surface contact regions 232 that are each in contact with the conductive paths 241, 242 that extend through their respective passivation layer stacks 218, 220. After performing step 308, the regions of the patterned back metal layer 406 will densify and form the conductive paths 242 that are in electrical contact with the rear surface contact region 232 and extend through the first layer 402 and openings 403 in the second layer 404 so that the various regions of patterned metal contacts can be subsequently connected together to form a back surface contact structure as discussed above. In one embodiment, the peak firing temperature may be controlled between about 600 degrees Celsius and about 900 degrees Celsius, such as about 800 degrees Celsius for short time period, such as between about 8 seconds and about 12 seconds, for example, about 10 seconds. The firing process will also assist in evaporating the polymer or etchant materials found in the back contact metal paste 222 and the front contact structures 226.

Second Alternate Processing Sequence

Figure 5:
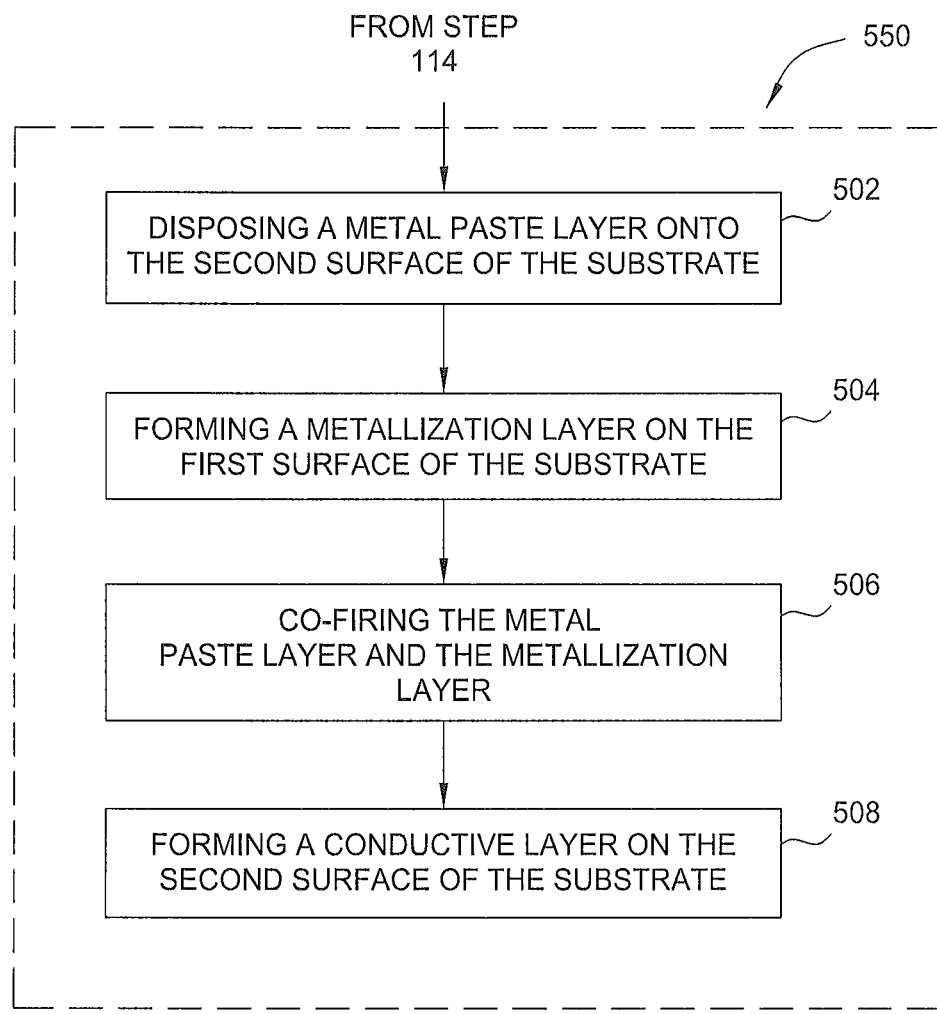
FIG. 5 depicts a block diagram of a processing sequence used to form solar cell devices in accordance with another embodiment of the present invention.
Figure 6:
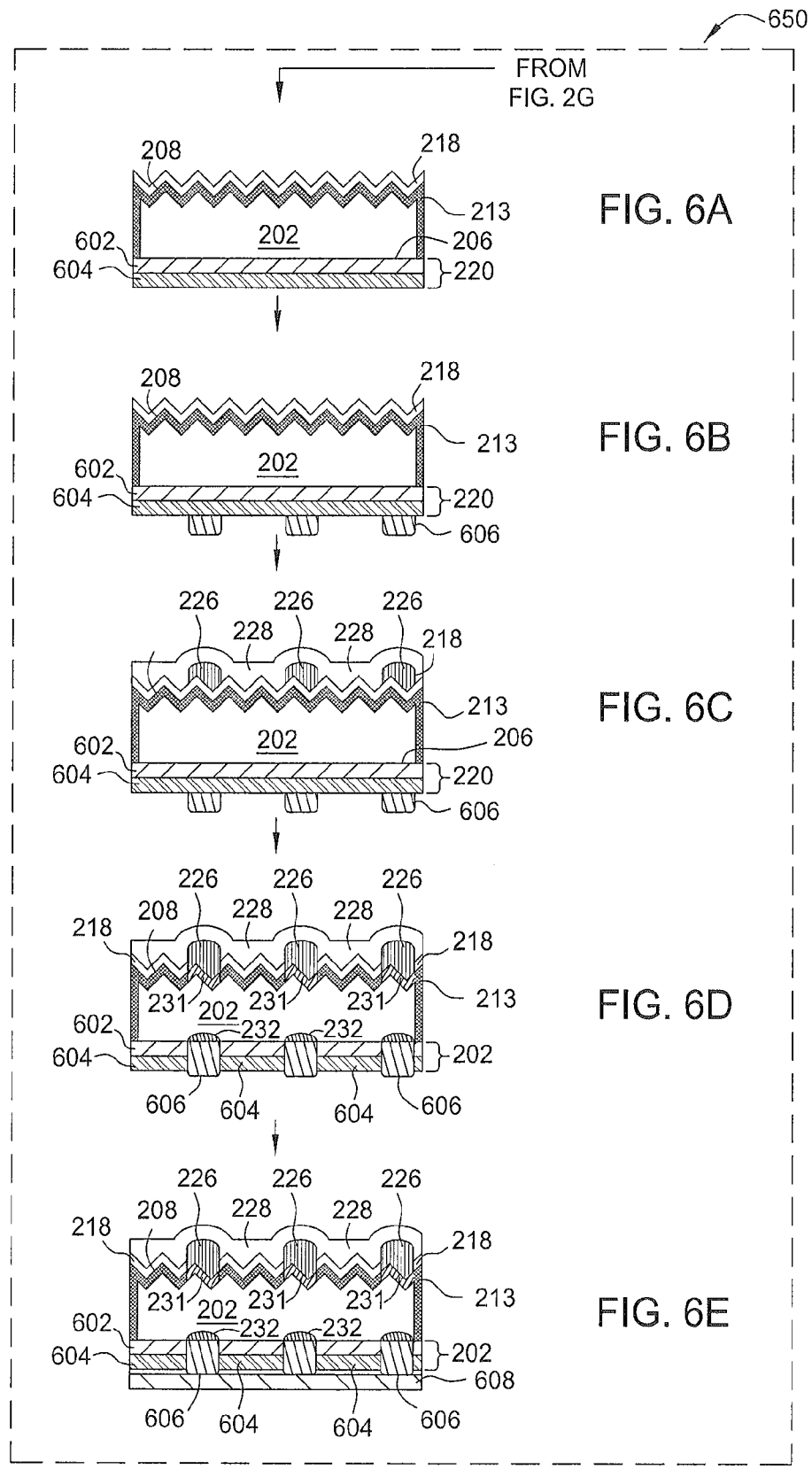
FIGS. 6A-6E depict cross-sectional views of a solar cell substrate during different stages using a processing sequence of FIG. 5 according to another embodiment of the invention.

FIG. 5 depicts a block diagram of a processing sequence used to form solar cell devices in accordance with another embodiment of the present invention. FIGS. 6A-6E are cross-sectional views that illustrate regions of a solar cell substrate during different stages of a processing sequence that is shown in FIG. 5 according to another embodiment of the invention. The steps 502 to 508 shown in box 550, which are depicted in FIG. 5, are performed after steps 102-114 (FIG. 1) have been performed, and thus may replace steps 116-122 shown in the box 150. The structures depicted in FIGS. 6A-6E are manufactured after the structure illustrated in FIG. 2G (step 114) has been formed, and thus the structures illustrated in FIGS. 2H-2K, and shown in the box 250, are replaced with the structures depicted in FIGS. 6A-6E found in box 550. FIGS. 6A-6E are cross sectional views of a solar cell device during the different processing steps performed within the processing sequence found in box 550, which include steps 502-508 depicted in FIG. 5.

In one embodiment, as shown in FIG. 6A, the passivation layer 220 comprises a composite layer stack, having a first layer 602 disposed on the back surface 206 of the substrate 202 and a second layer 604 disposed on the first layer 602. In one configuration, the passivation layer 220 depicted in FIG. 6A is fabricated from a composite film in which the first and the second layers 602, 604 comprise a material selected from the group of silicon oxide, silicon nitride, aluminum oxide layer, tantalum oxide layer, titanium oxide layer, or any other suitable materials. In one embodiment, the passivation layer 220 comprises a first layer 602 that comprises aluminum oxide ($Al_xO_y$) and a second layer 604 that comprises silicon nitride ($Si_xN_y$). The aluminum oxide layer and the silicon nitride layer may also be formed by any suitable deposition techniques, such as atomic layer deposition (ALD) process, plasma enhanced chemical vapor deposition (PECVD) process, metal-organic chemical vapor deposition (MOCVD), sputter process or the like. In one embodiment, the first layer 602 of the passivation layer 220 is an aluminum oxide layer ($Al_xO_y$) is formed by a MOCVD or ALD process having a thickness between about 5 nm and about 120 nm and the second layer 604 of the passivation layer 220 is a silicon nitride layer formed by a plasma enhanced chemical vapor deposition (PECVD) process having a thickness between about 5 nm and about 120 nm.

At step 502, after the passivation layer 220 is formed on the back surface 206 of the substrate 202, similar to the process performed at step 116 depicted in FIG. 1 and FIG. 2H, a back contact metal paste 606 (FIG. 6B) is selectively deposited on the passivation layer 220 to form metal contacts by use of an ink jet printing, rubber stamping, stencil printing, screen printing, or other similar process to form and define a desired pattern where electrical contacts to the underlying substrate surface (e.g., silicon) are formed. In one embodiment, the back contact metal paste 606 is disposed on the passivation layer 220 by a screen printing process in which the back contact metal paste 606 is printed on passivation layer 220 through a stainless steel screen with a mask that has an array of features ranging in size from about 10 μm to about 1000 μm in size that are placed on around 2 mm centers. In one example, the formed pattern of metal paste features disposed on the passivation layer 220 comprise an array of metal paste dots that are between about 50 μm and about 200 μm in size and between about 5 and 20 μm thick that are placed on between about 300 μm and 1500 μm centers. The metal paste features may be formed in a hexagonal close packed (HCP) array, rectangular array or other desirable pattern.

As discussed above, material of the back conductive metal paste 606 may be similar to the metal paste 222 discussed above with referenced to step 116, and is discussed in further detail below. In one example, the back conductive metal paste 606 may configured to form back metal contact from silver, silver alloy, copper (Cu), tin (Sn), cobalt (Co), rhenium (Rh), nickel (Ni), zinc (Zn), lead (Pb), and/or aluminum (Al), or other suitable metal sources to provide proper metal source for forming the back metal contacts in the passivation layer 220. In one example, the back contact metal paste 222 may include aluminum (Al) particles formed in polymer resin having glass frits disposed therein to form aluminum metal contacts in the passivation layer 220.

At step 504, similar to the processes performed at step 118 depicted in FIG. 1 and FIG. 2I, metallization layers, including front contact structures 226 and/or the conductive bus-line 228, are formed on the antireflection/passivation layer 218 on the front textured surface 208 of the substrate 202, as shown in FIG. 6C. The front contact structures 226 may be deposited in a pattern on the substrate 202, as discussed above. The front contact structures 226 may be between about 500 angstroms and about 50,000 angstroms (Å) thick, about 10 μm to about 200 μm wide, and contain a metal, such as aluminum (Al), silver (Ag), tin (Sn), cobalt (Co), rhenium (Rh), nickel (Ni), zinc (Zn), lead (Pb), palladium (Pd), molybdenum (Mo), titanium (Ti), vanadium (V), tungsten (W), or chromium (Cr). In one example, the front conductive contact 226 is a metallic paste that contains aluminum (Al) or silver (Ag).

The conductive bus-lines 228 disposed on the front contact structures 226 are formed and attached to at least a portion of the front contact structures 226 to allow portions of the solar cell device to be connected to other solar cells or external devices. In one embodiment, the conductive bus-lines 228 are connected to the front contact structures 226 using a soldering material that may contain a solder material (e.g., Sn/Pb, Sn/Ag) if necessary. In one embodiment, the conductive bus-lines 228 are about 200 microns thick and contains a metal, such as aluminum (Al), copper (Cu), silver (Ag), gold (Au), tin (Sn), cobalt (Co), rhenium (Rh), nickel (Ni), zinc (Zn), lead (Pb), palladium (Pd), and/or aluminum (Al). In one embodiment, each of the conductive bus-lines 228 are formed from a wire that is about 30 gauge (AWG: ~0.254 mm) or smaller in size. In one embodiment, the conductive bus-lines 228 are coated with a solder material, such as a Sn/Pb or Sn/Ag solder material.

At step 506, similar to the processes performed at step 120 depicted in FIG. 1 and FIG. 2J, after the back contact paste 606, the front contact structures 226 and the conductive bus-line 228 are all formed on both the back surface 206 and the front textured surface 208, a co-firing process is performed to simultaneously thermally process the back contact paste 606, the front contact structures 226 and the conductive bus-lines 228 all at once, as shown in FIG. 6D. As discussed with referenced to the description of step 120, the second layer 604 of the passivation layer 220 and/or the antireflection/passivation layer 218 are both formed during the co-firing process, by use of the back contact metal paste 606 and the front contact structures 226, to form front side electrical contact regions 231 and rear surface contact regions 232 that are each in contact with the conductive paths 241, 242 that extend through their respective passivation layer stacks 218, 220. After performing step 506, the regions of the back contact paste 606 will densify and form conductive paths 242 that are in electrical contact with the rear surface contact regions 232 so that the various regions of the formed conductive paths can be subsequently connected together to form a back surface contact structure as discussed above.

At step 508, after performing step 506, a conductive layer 608, similar to the conductive layer 224 described at step 122 of FIG. 1 and FIG. 2K, is disposed over the back metal contact 606 to complete the solar cell device manufacture process, as shown in FIG. 6E. As discussed above, the conductive layer 608 may be a monolithic piece of material such as an aluminum, tin or copper foil material, blanket deposited metal layer or other suitable metallic materials manufactured by any suitable deposition techniques, such as screen print process, atomic layer deposition (ALD) process, physical vapor deposition (PVD) process, plasma enhanced chemical vapor deposition (PECVD) process, metal-organic chemical vapor deposition (MOCVD), sputter process or the like. The conductive layer 608 may have a thickness between about 500 angstroms and about 50,000 angstroms (Å) thick, about 10 μm to about 200 μm wide, and contain a metal, such as aluminum (Al), silver (Ag), tin (Sn), cobalt (Co), rhenium (Rh), nickel (Ni), zinc (Zn), lead (Pb), palladium (Pd), molybdenum (Mo), titanium (Ti), vanadium (V), tungsten (W), or chromium (Cr). In one example, the conductive layer 608 comprises an aluminum (Al) containing foil material, such as a 1000 series aluminum foil material (Aluminum Association designation). The conductive layer 608 may also be a tin or copper foil material. In some embodiments, the conductive layer 608 may comprise nickel, titanium, or other useful conductive material. In one example, the conductive layer 608 comprises a 50 μm thick sheet of 1145 aluminum. In some cases, the conductive layer 608 is cut into a desired shape and/or pattern from a continuous roll of foil material. In some embodiments, the conductive layer 608, such as a metal foil material, can be bonded to the conductive paths 242 by us of an electrically conductive adhesive (ECA) material, such as a metal filled epoxy, metal filled silicone or other similar polymeric material that has a conductivity that is high enough to conduct the electricity generated by the formed solar cell. In one example, the ECA has a resistivity that is less than about $1 \times 10^{-5}$ ohm-centimeters.

In one configuration or the process sequence, the conductive layer 608 is formed from an inexpensive metallic paste that contains aluminum (Al) and is deposited by a flood type screen printing process and then the deposited a metallic paste is densified in a second thermal process to form the conductive layer 608. The screen printing process may be performed by a Softline™ system available from Applied materials Italia S.r.l., a division of Applied materials, Inc. of Santa Clara, Calif.

Third Alternate Processing Sequence

Figure 7:
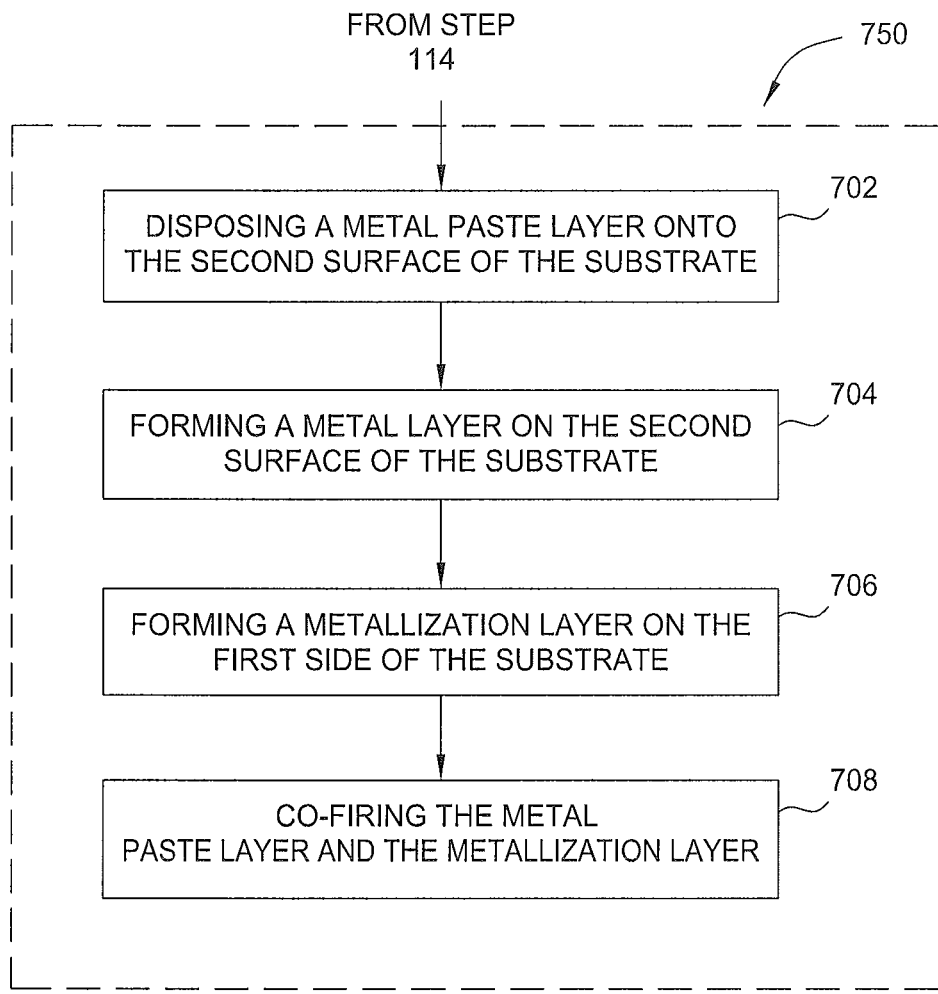
FIG. 7 depicts a block diagram of a processing sequence used to form solar cell devices in accordance with another embodiment of the present invention.

FIG. 7 depicts a block diagram of a processing sequence used to form solar cell devices in accordance with another embodiment of the present invention. FIGS. 8A-8D are cross-sectional views that illustrate portions of a solar cell substrate during different stages of a processing sequence 750 shown in FIG. 7 according to another embodiment of the invention. The steps 702 to 708 shown in box 750, which are depicted in FIG. 7, are generally performed after steps 102-114 (FIG. 1) have been performed, and thus may replace steps 116-122 shown in the box 150. The structures depicted in FIGS. 8A-8D are manufactured after the structure illustrated in FIG. 2G (step 114) has been formed, and thus the structures illustrated in FIGS. 2H-2K, and shown in the box 250, are replaced with the structures depicted in FIGS. 8A-8D found in box 750. FIGS. 8A-8D are cross sectional views of a solar cell device during the different processing steps performed within the processing sequence found in box 750, which include steps 702-708 depicted in FIG. 7.

At step 702, similar to the process performed at step 116 depicted in FIG. 1 and FIG. 2H, back contact metal paste 222 is selectively deposited on the passivation layer 220 to form metal contacts by use of an ink jet printing, rubber stamping, stencil printing, screen printing, or other similar process to form and define a desired pattern where electrical contacts to the underlying substrate surface (e.g., silicon) are formed, as depicted in FIG. 8A. In this particular embodiment, the passivation layer 220 as described herein in FIG. 8A-8D may be an aluminum oxide layer. In one embodiment, the back contact metal paste 222 is disposed on the passivation layer 220 by a screen printing process in which the back contact metal paste 222 is printed on passivation layer 220 through a stainless steel screen with a mask that has an array of features ranging in size from about 10 µm to about 1000 µm in size that are placed on around 2 mm centers. In one example, the formed pattern of metal paste features disposed on the passivation layer 220 comprise an array of metal paste dots that are between about 50 µm and about 200 µm in size and between about 5 and 20 µm thick that are placed on between about 300 µm and 1500 µm centers. The metal paste features may be formed in a hexagonal close packed (HCP) array, rectangular array or other desirable pattern.

As discussed above, the back conductive metal paste 222 may include etchant that may react with a portion of the passivation layer 220 during the subsequent firing process to form portions of the back contact structure as needed. In one embodiment, as discussed above, the back conductive metal paste 222 may configured to form back metal contact from silver, silver alloy, copper (Cu), tin (Sn), cobalt (Co), rhenium (Rh), nickel (Ni), zinc (Zn), lead (Pb), and/or aluminum (Al), or other suitable metal sources to provide proper metal source for forming the back metal contacts in the passivation layer 220. The back contact metal paste 222 may include aluminum (Al) particles formed in polymer resin having glass frits disposed therein to form aluminum metal contacts in the passivation layer 220.

At step 704, similar to the processes performed at step 122 depicted in FIG. 1 and FIG. 2K, a conductive layer 802, such as back contact metal paste, may be formed and attached to at least a portion of back conductive metal paste 222, as shown in FIG. 4B. The conductive layer 802 may be a monolithic piece of material such as an aluminum, copper or tin foil material, blanket deposited metal layer or other suitable metallic materials manufactured by any suitable deposition techniques, such as screen print process, atomic layer deposition (ALD) process, physical vapor deposition (PVD) process, plasma enhanced chemical vapor deposition (PECVD) process, metal-organic chemical vapor deposition (MOCVD), sputter process or the like. The conductive layer 802 may have a thickness between about 500 angstroms and about 50,000 angstroms (Å) thick, about 10 µm to about 200 µm wide, and contain a metal, such as aluminum (Al), silver (Ag), tin (Sn), cobalt (Co), rhenium (Rh), nickel (Ni), zinc (Zn), lead (Pb), palladium (Pd), molybdenum (Mo), titanium (Ti), vanadium (V), tungsten (W), or chromium (Cr). In one example, conductive layer 802 comprises an aluminum (Al) containing foil material, such as a 1000 series aluminum foil material (Aluminum Association designation). The conductive layer 802 may also be a tin or copper foil material. In some embodiments, the conductive layer 802 may comprise nickel, titanium, copper, silver or other useful conductive material. In one example, the conductive layer 802 comprises a 50 µm thick sheet of 1145 aluminum. In some cases, the conductive layer 802 may be cut into a desired shape and/or pattern from a continuous roll of foil material. In one example, the conductive layer 802 is an inexpensive metallic paste that contains aluminum (Al) and is deposited by screen printing a metallic paste and heating the metallic paste to a desired temperature to sinter the paste.

At step 706, similar to the processes performed at step 118 depicted in FIG. 1 and FIG. 2I, metallization layers, including the front contact structures 226 and/or the conductive bus-line 228, are formed on the antireflection/passivation layer 218 on the front textured surface 208 of the substrate 202, as shown in FIG. 4C. The front contact structures 226 may be deposited in a pattern on the substrate 202 and comprise one or more of the materials described above. In one example, the front conductive contact 226 is a metallic paste that contains silver (Ag).

The conductive bus-lines 228 disposed on the front contact structures 226 are formed and attached to at least a portion of the front contact structures 226 to allow portions of the solar cell device to be connected to other solar cells or external devices. In one embodiment, the conductive bus-lines 228 are connected to the front contact structures 226 using a soldering material that may contain a solder material (e.g., Sn/Pb, Sn/Ag) if necessary. In one embodiment, the conductive bus-lines 228 is about 200 microns thick and contains a metal, such as aluminum (Al), copper (Cu), silver (Ag), gold (Au), tin (Sn), cobalt (Co), rhenium (Rh), nickel (Ni), zinc (Zn), lead (Pb), palladium (Pd), and/or aluminum (Al). In one embodiment, each of the conductive bus-lines 228 are formed from a wire that is about 30 gauge (AWG: ~0.254 mm) or smaller in size. In one embodiment, the conductive bus-lines 228 are coated with a solder material, such as a Sn/Pb or Sn/Ag solder material.

At step 708, similar to the processes performed at step 120 depicted in FIG. 1 and FIG. 2J, after the conductive layer 802, the front contact structures 226 and the conductive bus-lines 228 are all formed on both the front textured surface 208 and the back surface 206, a co-firing process may be performed to simultaneously anneal the conductive layer 802, the front contact structures 226 and the conductive bus-lines 228 all at once, as shown in FIG. 8D. As discussed with referenced to the description of step 120, potions of the passivation layer 220 and/or the antireflection/passivation layer 218 may be formed during the co-firing process to form front side electrical contact regions 231 and rear surface contact regions 232 that are each in contact with the conductive paths 241, 242 that extend through their respective passivation layer stacks 218, 220.

FIGS. 9A-9C depict some examples of various patterns in which a back contact metal paste 222, 606 may be disposed on the passivation layer(s) in accordance with one of the embodiments described herein. The contact metal paste 222, 606 may be formed as an array of metal paste features in any geometry, such as a circular pattern 902 as depicted in FIG. 9A or a square pattern 904 depicted in FIG. 9B, with equal or non-equal distance to each other formed. Furthermore, the metal paste features may be formed in a hexagonal close packed (HCP) array, rectangular array or other desirable pattern. In another embodiment, the metal printing process of the contact metal paste 222, 606 may be performed using a two step process so as to form metal paste features on the substrate with a stacked structure. For example, the metal printing process may include a first print process performed to first print a first layer of metal paste features having a circular pattern 906 and formed in an array 910, as shown in FIG. 9C, and then subsequently, a second print process is performed to print a second metal paste layer 908 over the arrays 910 to form an H-pattern feature to connect the metal paste features 906 in the arrays 910 with the second layer of the metal paste line 908.

Therefore, using the processes and materials described herein, the front contact structures and the back contact structures may be simultaneously formed in one step, thereby advantageously reducing the need for additionally thermal processing steps, elimination of the need to etch one or more of deposited the passivation layers due to the use of a fire-through metallization process, and, thus, saving and reducing manufacture cost, cycle time and throughput. In addition, by depositing a simple patterned metallic conductive regions in the back structure, and use of a low cost interconnection layer to connect the patterned back contact regions together and as a light reflector on the back of the substrate, the conversion efficiency of the solar cell devices may also be increased and the cost to produce the solar cell can be reduced.

While the foregoing is directed to embodiments of the present invention, other and further embodiments of the invention may be devised without departing from the basic scope thereof, and the scope thereof is determined by the claims that follow.

What is claimed is:

1. A method of manufacturing a solar cell device, comprising:
   providing a substrate having a first dielectric layer disposed on a front side of the substrate and a second dielectric layer disposed on a back side of the substrate, wherein the first dielectric layer comprises a silicon containing material selected from silicon oxide, silicon nitride or amorphous silicon;
   selectively disposing a first metal paste in a first pattern on at least a portion of the first dielectric layer;
   selectively disposing a second metal paste in a second pattern on a surface of the second dielectric layer, wherein the second dielectric layer is disposed between the portions of the second metal paste and the back side of the substrate and the second dielectric layer comprises aluminum oxide; and
   simultaneously heating the first and the second metal pastes disposed on the first and the second dielectric layers to form a first group of contacts in the first dielectric layer and a second group of contacts in the second dielectric layer, wherein at least a portion of the second metal paste forms a plurality of contact regions that each extend through the second dielectric layer from the surface of the second dielectric layer to the back side of the substrate.

2. The method of claim 1, wherein the second metal paste comprises aluminum.

3. The method of claim 1, further comprising:
   coupling a conductive layer to the contact regions formed in the second dielectric layer.

4. The method of claim 3, wherein the conductive layer comprises an aluminum, copper or tin foil.

5. The method of claim 1, wherein the first metal paste comprises silver.

6. The method of claim 1, wherein the second metal paste comprises aluminum.

7. The method of claim 1, wherein the first dielectric layer is a dielectric layer selected from a group consisting of silicon oxide layer, silicon nitride layer, silicon oxynitride layer or combinations thereof.

8. The method of claim 1, wherein the second dielectric layer comprises the aluminum oxide layer and a silicon nitride layer, wherein the silicon nitride layer is disposed on the aluminum oxide layer.

9. The method of claim 1, wherein selectively disposing the first metal paste on the first dielectric layer further comprises forming a metal bus line layer on the first group of contact metal paste.

10. The method of claim 1, wherein the metal bus line layer is a aluminum layer.

11. A method of manufacturing a solar cell device, comprising:
    providing a substrate having a first dielectric layer disposed on a front side of the substrate and a second dielectric layer disposed on a back side of the substrate, wherein the first dielectric layer comprises a silicon containing material selected from silicon oxide, silicon nitride or amorphous silicon and the second dielectric layer comprises a first layer disposed on a second layer that is disposed on the back side of the substrate, the second layer of the second dielectric layer is a aluminum oxide layer;
    selectively disposing a first metal paste in a first pattern on at least a portion of the first dielectric layer;
    performing a laser removal process to remove a portion of the first layer from the back side of the substrate to form openings in the first layer;
    selectively disposing a second metal paste in a second pattern on a first layer of the second dielectric layer, and a portion of the second metal paste filling at least a portion of the openings formed in the first layer;
    simultaneously heating the first and the second metal pastes disposed on the first and the second dielectric layers to form a first group of contacts in the first dielectric layer and a second group of contacts in the second dielectric layer, wherein at least a portion of the second metal paste forms a plurality of contact regions that each extend through the second dielectric layer from a surface of the first layer to the back side of the substrate.

12. The method of claim 11, further comprising:
    coupling a conductive layer to the contact regions formed in the second dielectric layer.

13. The method of claim 12, wherein the conductive layer comprises an aluminum, copper or tin foil.

14. The method of claim 11, wherein the first layer of the second dielectric layer is a silicon nitride layer.

15. The method of claim 11, wherein selectively disposing the first metal paste on the first dielectric layer further comprises forming a metal bus line layer on the first group of contact metal paste.

16. The method of claim 15, wherein the metal bus line layer is a aluminum layer.

17. The method of claim 11, wherein the first metal paste comprises silver and the second metal paste comprises aluminum.

* * * * *

UNITED STATES PATENT AND TRADEMARK OFFICE
CERTIFICATE OF CORRECTION

PATENT NO.        : 8,859,324 B2                                        Page 1 of 1
APPLICATION NO.   : 13/739390
DATED             : October 14, 2014
INVENTOR(S)       : Stewart et al.

It is certified that error appears in the above-identified patent and that said Letters Patent is hereby corrected as shown below:

In the Specification

In Detailed Description:

Column 7, Line 55, please delete "S.r.I.," and insert -- S.r.l., -- therefor;

Column 9, Line 28, please delete "S.r.I.," and insert -- S.r.l., -- therefor;

Column 11, Line 12, please delete "S.r.I.," and insert -- S.r.l., -- therefor;

Column 13, Line 15, please delete "S.r.I.," and insert -- S.r.l., -- therefor;

Column 16, Line 59, please delete "S.r.I.," and insert -- S.r.l., -- therefor.

Signed and Sealed this
Fourteenth Day of April, 2015

Michelle K. Lee
*Director of the United States Patent and Trademark Office*